United States Patent
Kim

(10) Patent No.: US 12,324,280 B2
(45) Date of Patent: Jun. 3, 2025

(54) DISPLAY DEVICE AND MANUFACTURING METHOD THEREOF

(71) Applicant: Samsung Display Co., Ltd., Yongin-si (KR)

(72) Inventor: Geun Tak Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 770 days.

(21) Appl. No.: 17/347,411

(22) Filed: Jun. 14, 2021

(65) Prior Publication Data

US 2022/0102584 A1 Mar. 31, 2022

(30) Foreign Application Priority Data

Sep. 29, 2020 (KR) .................. 10-2020-0127494

(51) Int. Cl.
| | |
|---|---|
| H10H 20/01 | (2025.01) |
| H01L 25/075 | (2006.01) |
| H01L 25/16 | (2023.01) |
| H05K 5/10 | (2025.01) |
| H10D 8/75 | (2025.01) |
| H10D 10/80 | (2025.01) |

(Continued)

(52) U.S. Cl.
CPC ........ *H10H 20/8312* (2025.01); *H10H 20/01* (2025.01); *H10H 29/142* (2025.01); *H10H 20/032* (2025.01)

(58) Field of Classification Search
CPC ... H01L 33/382; H01L 27/156; H01L 33/005; H01L 2933/0016; H01L 33/20; H01L 33/24; H01L 33/44; H01L 33/62; H01L 25/0753; H01L 25/0756; H01L 25/167; H01L 27/1214
See application file for complete search history.

(56) References Cited

U.S. PATENT DOCUMENTS

| | | |
|---|---|---|
| 10,211,418 B2 | 2/2019 | Im et al. |
| 10,658,605 B2 | 5/2020 | Lee et al. |

(Continued)

FOREIGN PATENT DOCUMENTS

| | | |
|---|---|---|
| KR | 10-1672781 B1 | 11/2016 |
| KR | 10-1713818 B1 | 3/2017 |

(Continued)

OTHER PUBLICATIONS

Chia-Lung Tsai et al.; "Effects of Asymmetric Quantum Wells on the Structural and Optical Properties of InGaN-Based Light-Emitting Diodes"; Materials 2014; 7; pp. 3758-3771; doi:10.3390/ma7053758; Published on May 12, 2014.

(Continued)

*Primary Examiner* — Herve-Louis Y Assouman
(74) *Attorney, Agent, or Firm* — Womble Bond Dickinson (US) LLP

(57) ABSTRACT

An embodiment provides a display device including: a substrate; a first electrode and a second electrode spaced from each other on the substrate; and a first light emitting element and a second light emitting element between the first electrode and the second electrode, wherein the first light emitting element and the second light emitting element are electrically insulated from each other, and the first light emitting element and the second light emitting element have different lengths.

15 Claims, 26 Drawing Sheets

(51) Int. Cl.
  *H10D 30/01*    (2025.01)
  *H10D 84/83*    (2025.01)
  *H10H 20/831*   (2025.01)
  *H10H 29/14*    (2025.01)

(56) References Cited

U.S. PATENT DOCUMENTS

2017/0288093 A1*  10/2017  Cha ................. H01L 33/382
2017/0317228 A1   11/2017  Sung
2017/0338372 A1   11/2017  Teraguchi et al.
2018/0019426 A1*  1/2018   Im .................. H10K 50/115
2018/0287010 A1   10/2018  Sung
2021/0296538 A1*  9/2021   Li .................. H01L 33/005

FOREIGN PATENT DOCUMENTS

| | | | |
|---|---|---|---|
| KR | 10-2018-0009015 A | 1/2018 | |
| KR | 10-2019-0029831 A | 3/2019 | |
| KR | 10-2020-0077671 A | 7/2020 | |
| WO | WO-2020013408 A1 * | 1/2020 | ......... H01L 25/0753 |
| WO | WO-2020149474 A1 * | 7/2020 | ......... H01L 25/0753 |

OTHER PUBLICATIONS

Kun Zhou et al, "Remarkably reduced efficiency droop by using staircase thin InGaN quantum barriers in InGaN based blue light emitting diodes", Appl. Phys. Lett., vol. 105, pp. 173510-1-173510-4, Published on Oct. 31, 2014.

* cited by examiner

DISPLAY DEVICE AND MANUFACTURING METHOD THEREOF

CROSS-REFERENCE TO RELATED APPLICATION

This application claims priority to and the benefit of Korean Patent Application No. 10-2020-0127494 filed in the Korean Intellectual Property Office on Sep. 29, 2020, the entire content of which is incorporated herein by reference.

BACKGROUND

1. Field

The present disclosure relates to a display device and a manufacturing method thereof.

2. Description of the Related Art

As an interest in information displays and a demand for using portable information media have been increasing, there is an increasing focus on a demand and commercialization for display devices.

SUMMARY

The present disclosure has been made in an effort to provide a display device and a manufacturing method thereof that may improve light emission efficiency.

An embodiment of the present disclosure provides a display device including: a substrate; a first electrode and a second electrode spaced from each other on the substrate; and a first light emitting element and a second light emitting element arranged between the first electrode and the second electrode, wherein the first light emitting element and the second light emitting element are electrically insulated from each other, and the first light emitting element and the second light emitting element have different lengths.

A length of the second light emitting element may be shorter than that of the first light emitting element.

The display device may further include an insulation layer between the first light emitting element and the second light emitting element, wherein the first light emitting element and the second light emitting element may have a cylindrical shape, and the second light emitting element may be located at a concave portion of the insulation layer covering the first light emitting element.

The second light emitting element may be at least partially overlap one surface of the first light emitting element.

The first electrode may include a first lower electrode and a first upper electrode, where an insulation layer is located between the first lower electrode and the first upper electrode; the second electrode may include a second lower electrode and a second upper electrode, where the insulation layer is located between the second lower electrode and the second upper electrode; the first lower electrode and the second lower electrode may be spaced from each other in a first and are located at a same layer; the first upper electrode and the second upper electrode may be spaced from each other in a second direction perpendicular to the first direction and are located at a same layer; the first light emitting element may be located between the first lower electrode and the second lower electrode; and the second light emitting element may be located between the first upper electrode and the second upper electrode.

Another embodiment provides a display device including: a substrate; a first electrode and a second electrode on the substrate; a first light emitting element located above the first electrode and the second electrode; a second light emitting element located above the first light emitting element and having a different length from the first light emitting element; an insulation layer between the first light emitting element and the second light emitting element; a first contact electrode connecting a first end portion of the first light emitting element and a first end portion of the second light emitting element to the first electrode; and a second contact electrode connecting a second end portion of the first light emitting element and a second end portion of the second light emitting element to the second electrode.

A length of the second light emitting element may be shorter than that of the first light emitting element.

The display device may further include a first alignment electrode on the first electrode and the second electrode, wherein the first alignment electrode may include a first sub-alignment electrode and a second sub-alignment electrode located at a same layer; the first sub-alignment electrode may connect the first electrode and the first contact electrode; and the second sub-alignment electrode may connect the second electrode and the second contact electrode.

The first light emitting element may be at least partially overlap the first sub-alignment electrode and the second sub-alignment electrode.

The display device may further include two second alignment electrodes located at the same layer as the first alignment electrode, wherein the two second alignment electrodes may be spaced from the first sub-alignment electrode and the second sub-alignment electrode and are located between the first sub-alignment electrode and the second sub-alignment electrode.

The second light emitting element may be at least partially overlap the two second alignment electrodes.

The display device may further include a first auxiliary electrode and a second auxiliary electrode located at the same layer as the first alignment electrode, wherein the first auxiliary electrode and the second auxiliary electrode may be spaced from the first alignment electrode, where the first alignment electrode is located between the first auxiliary electrode and the second auxiliary electrode.

The first contact electrode may include a first lower contact electrode and a first upper contact electrode that are located at different layers, where the insulation layer is located between the first lower contact electrode and the first upper contact electrode; and the second contact electrode may include a second lower contact electrode and a second upper contact electrode that are located at different layers, where the insulation layer is located between the second lower contact electrode and the second upper contact electrode.

The first lower contact electrode may connect the first sub-alignment electrode and the first end portion of the first light emitting element; and the second lower contact electrode may connect the second sub-alignment electrode and the second end portion of the first light emitting element.

The first upper contact electrode may connect the first auxiliary electrode and the first end portion of the second light emitting element; and the second upper contact electrode may connect the second auxiliary electrode and the second end portion of the second light emitting element.

Another embodiment provides a manufacturing method of a display device including a substrate having a first alignment electrode on an upper surface thereof, the method including: spraying a first ink including a plurality of first light emitting elements on a partial area of the substrate overlapping the first alignment electrode to align the plurality of first light emitting elements; forming a first insulation layer to cover the plurality of first light emitting elements; and spraying a second ink including a plurality of second light emitting elements on the first insulation layer to align the plurality of second light emitting elements.

A length of the second light emitting elements may be shorter than that of the first light emitting elements.

The manufacturing method of the display device may further include forming a second insulation layer to cover the second light emitting elements; removing the second insulation layer so that an upper portion of the first alignment electrode, end portions of the first light emitting elements, and end portions of the second light emitting elements are exposed; and forming a contact electrode to contact the upper portion of the first alignment electrode, the end portions of the first light emitting elements, and the end portions of the second light emitting elements that are exposed.

The manufacturing method of the display device may further include forming a second alignment electrode on the first insulation layer before forming the first insulation layer and aligning the second light emitting elements, herein the second light emitting elements may be aligned by the second alignment electrode.

The manufacturing method of the display device may further include forming a third insulation layer on the second light emitting elements; removing portions of the first insulation layer and the third insulation layer; and forming a contact electrode to contact an upper portion of the first alignment electrode, end portions of the first light emitting elements, and the end portions of the second light emitting elements that are exposed.

According to some embodiments, because a second light emitting element is disposed between first light emitting elements with an insulation layer therebetween, it is possible to increase a density of the light emitting elements in a pixel. Therefore, luminance of the display device may increase, and a life-span thereof may increase.

In some embodiments, because a first light emitting element and a second light emitting element are arranged through a primary inkjet printing process and a secondary inkjet printing process, respectively, it is possible to improve a phenomenon in which light-emitting elements are aggregated, compared with performing only an inkjet printing process. Therefore, it is possible to improve emission efficiency of the display device.

Aspects of the embodiment are not limited by what is illustrated in the above, and more various aspects are included in the present disclosure.

DETAILED DESCRIPTION

Figure 1:
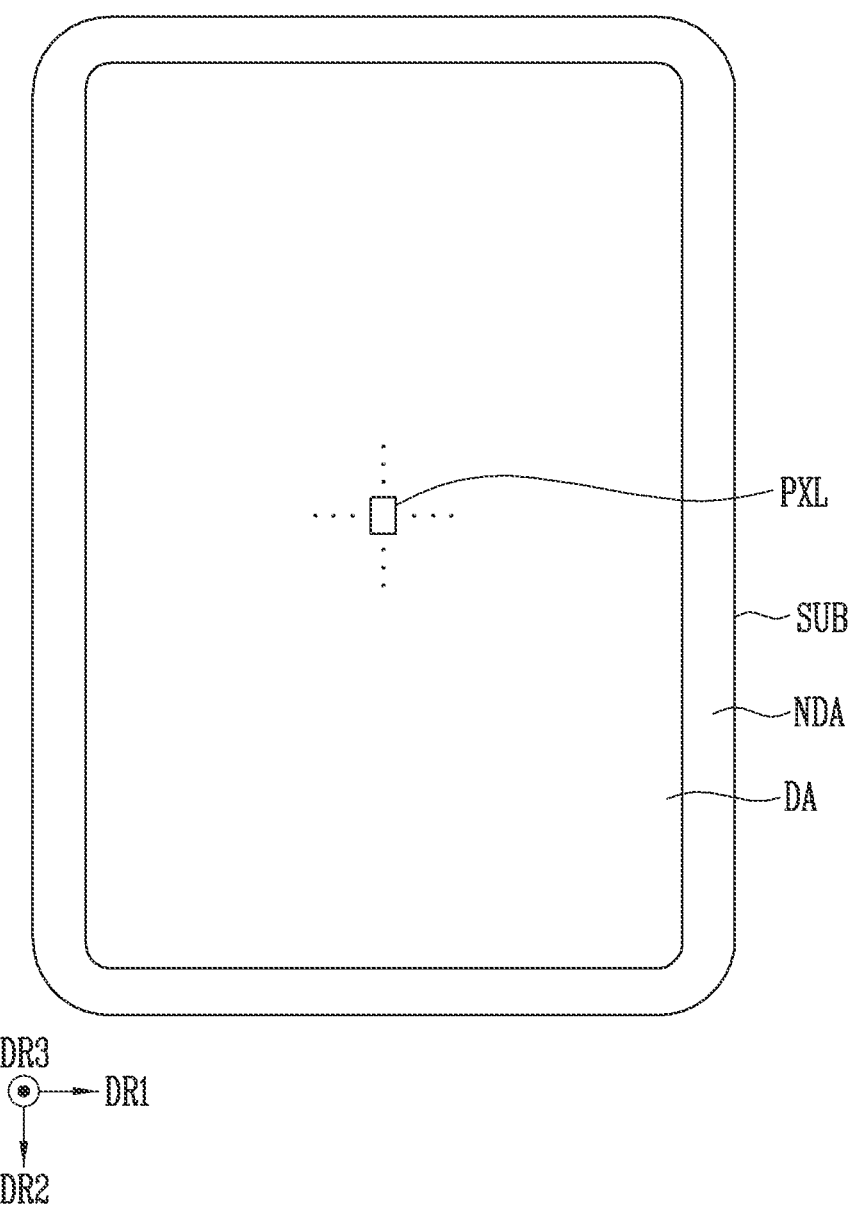
FIG. 1 illustrates a schematic top plan view of a display device according to an embodiment.

Because the present disclosure may be variously modified and have various forms, embodiments will be illustrated and described in detail in the following section. This, however, by no means restricts the disclosure to the specific embodiments, and it is to be understood as embracing all changes, equivalents, and substitutes included in the spirit and scope of the present disclosure.

Terms such as first, second, and the like will be used only to describe various constituent elements, and are not to be interpreted as limiting these constituent elements. The terms are only used to differentiate one constituent element from other constituent elements. For example, a first constituent element could be termed a second constituent element, and similarly, a second constituent element could be termed as a first constituent element, without departing from the scope of the present disclosure. Singular forms are intended to include plural forms unless the context clearly indicates otherwise.

In the present disclosure, it should be understood that the term "include", "comprise", "have", or "configure" indicates that a feature, a number, a step, an operation, a constituent element, a part, or a combination thereof described in the current disclosure is present, but does not exclude a possibility of presence or addition of one or more other features, numbers, steps, operations, constituent elements, parts, or combinations, in advance. It will be understood that when an element such as a layer, film, region, or substrate is referred to as being "on" another element, it can be directly on the other element or intervening elements may also be present. In the present disclosure, when a portion of a layer, film, region, area, plate, or the like is referred to as being formed "on" (or "at") another portion, the formed direction is not limited to an upper direction but includes a lateral or lower direction. In contrast, when an element of a layer, film, region, plate, or the like is referred to as being "below" another element, it may be directly below the other element, or intervening elements may be present.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the scope of the present disclosure.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Hereinafter, a display device according to an embodiment of the present disclosure will be described with reference to drawings related to the embodiment of the present disclosure.

Hereinafter, a horizontal direction is indicated as a first direction DR1, a vertical direction perpendicular to the horizontal direction is indicated as a second direction DR2, and a direction perpendicular to the first and second directions DR1 and DR2 is indicated as a third direction DR3.

FIG. 1 illustrates a schematic top plan view of a display device according to an embodiment.

Referring to FIG. 1, a display device according to an embodiment may include a substrate SUB, and a plurality of pixels PXL that are provided on the substrate SUB and each of the pixels PXL includes at least one light emitting element LD.

The substrate SUB may be a rigid substrate or a flexible substrate, and may include a transparent insulating material to transmit light.

The substrate SUB includes a display area DA for displaying an image, and a non-display area NDA surrounding the display area DA without displaying an image (e.g., the non-display area NDA may surround the display area DA along the edge or periphery of the display area DA).

The display area DA may be an area in which a plurality of pixels PXL is provided. The non-display area NDA may be an area in which a driver for driving the pixels PXL and a portion of a wire part for connecting the pixels PXL and the driver are provided.

The pixel PXL includes one or more of light emitting elements (LD in FIG. 2) driven by signals (e.g., a set or predetermined signals) (for example, a scan signal and a data signal) and/or a power source (e.g., a set or predetermined power source) (for example, a first driving power source and a second driving power source). The light emitting element LD may form a light source of each pixel PXL. The light emitting element LD has a size as small as nano-scale to micro-scale, and may be mutually connected in parallel with light emitting elements LD disposed to be adjacent thereto, but the present disclosure is not limited thereto.

The driver may provide a signal (e.g., a set or predetermined signal) and a power source (e.g., a set or predetermined power source) to each pixel PXL through the wire part, thereby controlling driving of the pixel PXL. The driver may include a scan driver, a light emission driver, and a data driver, and a timing controller.

The wire part may electrically connect the driver and the pixels PXL. The wire part provides a signal to each pixel PXL, and it may be signal lines connected to each pixel PXL, for example, a fan-out line connected to a scan line, a data line, a light emitting control line, and the like. In some embodiments, the wire part may be a fan-out line connected to signal lines connected to each pixel PXL, for example, connected to a control line, a sensing line, and the like, in order to compensate for changes in electrical characteristics of each pixel PXL in real time.

In FIG. 1, only one pixel PXL is illustrated, but a plurality of pixels PXL may be substantially provided in the display area DA. In the present embodiment, the pixels PXL may be arranged in the display area DA in a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea.

The display device according to some embodiments of the present disclosure may be applied to an electronic device in which a display surface is applied to at least one surface thereof such as a smart phone, a television, a tablet PC, a mobile phone, an image phone, an electron book reader, a desktop PC, a laptop PC, a netbook computer, a workstation, a server, a PDA, a portable multimedia player (PMP), an MP3 player, a medical device, a camera, or a wearable device.

It is shown that the display device according to some embodiments has a rectangular plate shape having two pairs of sides parallel to each other and has rounded corners, but the present disclosure is not limited thereto. In some embodiments, the display device may be implemented in various shapes such as a rectangular shape with right angle corners, a square shape, and a circular shape.

Hereinafter, a connection relationship in one pixel of a display device according to an embodiment will be described with reference to FIG. 2.

Figure 2:
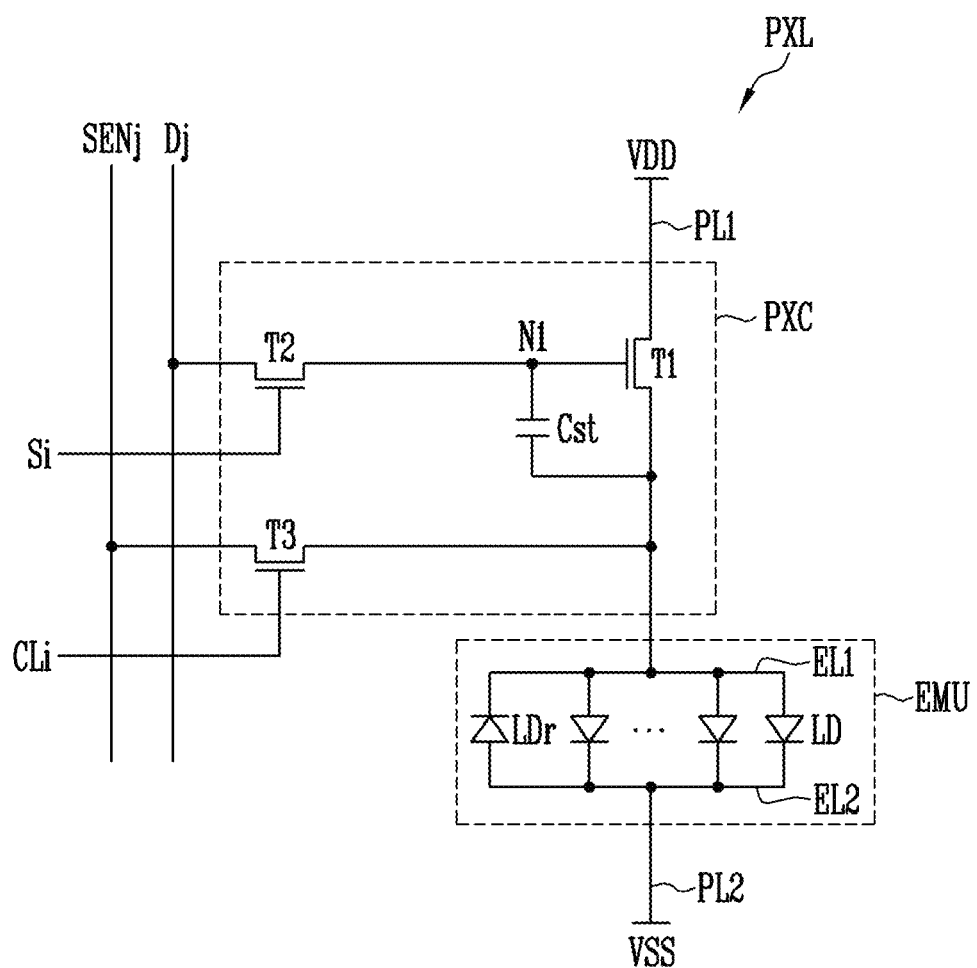
FIG. 2 illustrates a circuit diagram of an electrical connection relationship between constituent elements included in one pixel of a display device according to an embodiment.

FIG. 2 illustrates a circuit diagram of an electrical connection relationship between constituent elements included in one pixel of a display device according to an embodiment.

Referring to FIG. 2, the pixel PXL may include a light emitting unit EMU that generates light having luminance corresponding to a data signal. In some embodiments, the pixel PXL may further selectively include a pixel circuit PXC for driving the light emitting unit EMU.

The light emitting unit EMU includes a plurality of light emitting elements LD connected in parallel between a first power line PL1 to which the voltage of the first driving power source VDD is applied and a second power line PL2 to which the voltage of the second driving power source VSS is applied.

For example, the light emitting unit EMU may include a first electrode EL1 connected to the first power source VDD via the pixel circuit PXC and the first power line PL1, a second electrode EL2 connected to the second power source VSS through the second power line PL2, and a plurality of light emitting elements LD connected in parallel in the same direction between the first and second electrodes EL1 and EL2. In some embodiments, the first electrode EL1 may be an anode, and the second electrode EL2 may be a cathode.

Each of the light emitting element LD included in the light emitting unit EMU may include one end portion connected to the first driving power source VDD through the first electrode EU and the other end portion connected to the second driving power source VSS through the second electrode EL2.

The first driving power source VDD and the second driving power source VSS may have different potentials. For example, the first driving power source VDD may be set as a high potential power source, and the second driving power source VSS may be set as a low potential power source. In this case, a potential difference between the first and second driving power sources VDD and VSS may be set to be equal to or higher than a threshold voltage of the light emitting elements LD during a light emitting period of the pixel PXL.

As described above, each of light emitting elements LD connected in parallel in the same direction (for example, a forward direction) between the first electrode EL1 and the second electrode EL2 respectively supplied with voltages of different potentials may form respective effective light source. These effective light sources may collectively form the light emitting unit EMU of the pixel PXL.

In some embodiments, the light emitting unit EMU may further include at least one ineffective light source, for example, a reverse light emitting element LDr, in addition to the light emitting elements LD forming respective effective light sources. The reverse light emitting element LDr is connected in parallel between the first and second electrodes EL1 and EL2 together with the light emitting elements LD forming the effective light sources, but is connected between the first and second electrodes EL1 and EL2 in the opposite direction with respect to the light emitting elements LD. The reverse light emitting element LDr maintains an inactive state even when a driving voltage (e.g., a set or predetermined driving voltage) (for example, a driving voltage in the forward direction) is applied between the first and second electrodes EL1 and EL2, thus a current does not substantially flow in the reverse light emitting element.

The light emitting elements LD of the light emitting unit EMU may emit light with luminance corresponding to a driving current supplied through the corresponding pixel circuit PXC. For example, during each frame period, the pixel circuit PXC may supply a driving current corresponding to a gray value of corresponding frame data to the light emitting unit EMU. The driving current supplied to the light emitting unit EMU may be divided to flow in each of the light emitting elements LD. Therefore, while each light emitting element LD emits light with a luminance corresponding to the current flowing therein, the light emitting unit EMU may emit light having a luminance corresponding to the driving current.

The pixel circuit PXC is connected to a scan line Si and a data line Dj of the pixel PXL. For example, when the pixel PXL is disposed in an i-th (i is a natural number) row and a j-th (j is a natural number) column of the display area DA, the pixel circuit PXC of the pixel PXL may be connected to an i-th scan line Si and a j-th data line Dj of the display area DA. In some embodiments, the pixel circuit PXC may be connected to an i-th control line CLi and a j-th sensing line SENj of the display area DA.

The pixel circuit PXC may include first to third transistors T1 to T3 and a storage capacitor Cst.

A first terminal of the first transistor T1 (e.g., a driving transistor) is connected to the first driving power supply source VDD, and a second terminal thereof is electrically connected to the first electrode EL1. A gate electrode of the first transistor T1 is connected to a first node N1. Accordingly, the first transistor T1 may control an amount of driving current supplied to the light emitting elements LD in response to a voltage of the first node N1.

A first terminal of the second transistor T2 (e.g., a switching transistor) is connected to the data line Dj, and a second terminal thereof is connected to the first node N1. A gate electrode of the second transistor T2 is connected to the scan line Si. The second transistor T2 is turned on when a scan signal (e.g., a high level signal) of a turn-on voltage is supplied from the scan line Si, and electrically connects the data line Dj and the first node N1. In this case, a data signal of a corresponding frame is supplied to the data line Dj, and accordingly, the data signal is transmitted to the first node N1. The data signal transmitted to the first node N1 is charged in the storage capacitor Cst (e.g., the storage capacitor Cst may store a charge corresponding to the data signal transmitted to the first node N1).

The third transistor T3 is connected between the second terminal of the first transistor T1 and the sensing line SENj. For example, a first terminal of the third transistor T3 is connected to the second terminal of the first transistor T1, and a second terminal of the third transistor T3 is connected to the sensing line SENj. A gate electrode of the third transistor T3 is connected to the control line CLi. The third transistor T3 is turned on by a control signal (e.g., a high level signal) of a gate-on voltage supplied to the control line CLi during a sensing period (e.g., a set or predetermined sensing period) to electrically connect the sensing line SENj to the first transistor T1. The sensing period may be a period for extracting characteristic information (for example, a threshold voltage of the first transistor T1) of each of the pixels PXL disposed in the display area DA.

One electrode of the storage capacitor Cst is connected to the second driving power source VSS through the light emitting unit EMU and the second lower line PL2, and the other electrode thereof is connected to the first node N1. The storage capacitor Cst may charge a voltage (or hold a charge) corresponding to the data signal supplied to the first node N1, and may maintain the charged voltage until a data signal of a next frame is supplied.

FIG. 2 discloses the embodiment in which all of the first to third transistors T1 to T3 are N-type transistors, but the present disclosure is not limited thereto. In some embodiments, at least one of the first to third transistors T1 to T3 may be changed to a P-type transistor.

Although FIG. 2 discloses the embodiment in which the light emitting unit EMU is connected between the pixel circuit PXC and the second driving power source VSS, the light emitting unit EMU may also be connected between the first driving power source VDD and the pixel circuit PXC.

In addition, FIG. 2 illustrate the embodiments in which the light emitting elements LD forming each light emitting unit EMU are all connected in parallel, but the present disclosure is not limited thereto. In some embodiments, the light emitting unit EMU may be configured to include at least one series stage including a plurality of light emitting elements LD connected in parallel to each other. That is, the light emitting unit EMU may be configured to have a series/parallel mixed structure.

Hereinafter, a structure of the above-described light emitting element will be described with reference to FIG. 3.

Figure 3:
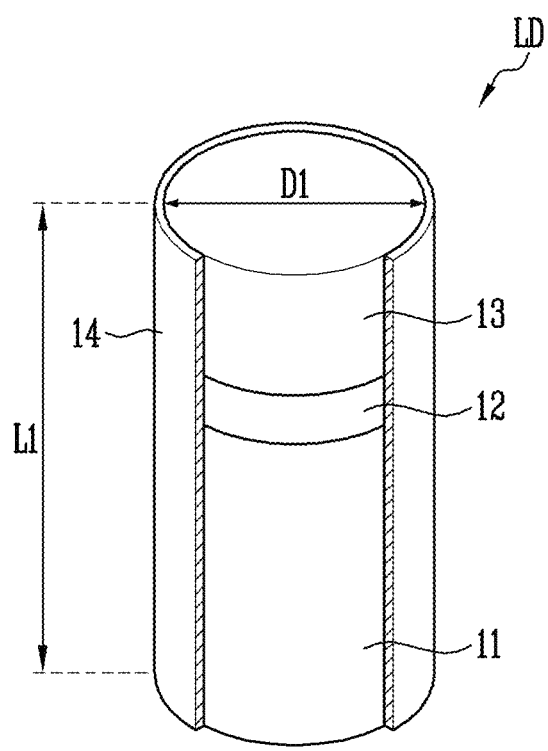
FIG. 3 illustrates a schematic perspective cutaway view of a light emitting element included in one pixel of a display device according to an embodiment.

FIG. 3 illustrates a schematic perspective cutaway view of a light emitting element included in one pixel of a display device according to an embodiment. FIG. 3 illustrates a light emitting element having a cylindrical shape, but a type and/or shape of the light emitting element according to the present disclosure is not limited thereto.

Referring to FIG. 3, the light emitting element LD according to some embodiments includes a first semiconductor layer 11, a second semiconductor layer 13, and an active layer 12 disposed between the first semiconductor layer 11 and the second semiconductor layer 13. For example, the light emitting element LD may be configured of a stacked body in which the first semiconductor layer 11, the active layer 12, and the second semiconductor layer 13 are sequentially stacked along a length L1 direction.

When an extending direction of the light emitting element LD is referred to as a length L1 direction, the light emitting element LD may be provided with one end portion and the other end portion along the length L1 direction. In some embodiments, one of the first and second semiconductor layers 11 and 13 may be disposed at one end portion of the light emitting element LD, and the other one of the first and second semiconductor layers 11 and 13 may be disposed at the other end portion of the light emitting element LD.

In some embodiments, the light emitting element LD may be a rod-shaped light emitting diode manufactured in a rod shape. In the present disclosure, "rod shape" refers to a rod-like shape or bar-like shape (that is, with an aspect ratio of greater than 1) that is long in the length L1 direction, such as a circular cylinder or a polygonal cylinder, but a shape of a cross section thereof is not particularly limited. For example, the length L1 of the light emitting element LD may be larger than a diameter D1 thereof (or a width of a cross section thereof).

In some embodiments, the light emitting element LD may have a size as small as nano-scale or micro-scale. The light emitting element LD may have the diameter D1 and/or the length L1 ranging from a nano scale to a micro scale. For example, the length L1 of the light emitting element LD may be about 100 nm to 10 μm, the diameter D1 of the light emitting element LD may be about 2 μm to 6 μm, and the aspect ratio of the light emitting element LD may range from about 1.2 to about 100. However, the size of the light emitting element LD in the present disclosure is not limited thereto. For example, the size of the light emitting element LD may be variously changed according to design conditions of various devices using a light emitting device using the light emitting element LD as a light source, for example, a display device.

The first semiconductor layer 11 may include at least one n-type semiconductor layer. For example, the first semiconductor layer 11 may include a semiconductor material of one of InAlGaN, GaN, AlGaN, InGaN, AlN, and InN, and may include a n-type semiconductor layer doped with a first conductive dopant such as Si, Ge, Sn, or the like. However, the material included in the first semiconductor layer 11 is not limited thereto, and the first semiconductor layer 11 may be made of various materials.

The active layer 12 is disposed on the first semiconductor layer 11, and may be formed to have a single or multi-quantum well (MQW) structure. In some embodiments, a clad layer doped with a conductive dopant may be formed at an upper portion and/or a lower portion of the active layer 12. For example, the clad layer may be formed as an AlGaN layer or an InAlGaN layer. In some embodiments, a material such as AlGaN and InAlGaN may be used to form the active layer 12, and in addition, various materials may form the active layer 12.

When a voltage of a threshold voltage or more is applied to respective ends of the light emitting element LD, the light emitting element LD emits light while electron-hole pairs are combined in the active layer 12. By controlling the light emission of the light emitting element LD by using this principle, the light emitting element LD may be used as a light source for various light emitting devices in addition to pixels of a display device.

The second semiconductor layer 13 is disposed on the active layer 12, and may include a semiconductor layer of a type different from that of the first semiconductor layer 11. For example, the second semiconductor layer 13 may include at least one p-type semiconductor layer. For example, the second semiconductor layer 13 may include at least one semiconductor material of InAlGaN, GaN, AlGaN, InGaN, AlN, and InN, and may include a p-type semiconductor layer doped with a second conductive dopant such as Mg, Zn, Ca, Sr, or Ba. However, the material included in the second semiconductor layer 13 is not limited thereto, and the second semiconductor layer 13 may be formed of various materials.

In the above-described embodiment, it is described that each of the first semiconductor layer 11 and the second semiconductor layer 13 are formed as one layer, but the present disclosure is not limited thereto. In the embodiment, each of the first semiconductor layer 11 and the second semiconductor layer 13 may further include at least one or more layers, for example, a cladding layer and/or a tensile strain barrier reducing (TSBR) layer according to the material of the active layer 12. The TSBR layer may be a strain reducing layer disposed between semiconductor layers having different lattice structures and serving as a buffer to reduce a difference in lattice constant. The TSBR layer may be formed of a p-type semiconductor layer such as p-GaInP, p-AlInP, or p-AlGaInP, but the present disclosure is not limited thereto.

In some embodiments, the light emitting element LD further includes an insulation film 14 provided on a surface thereof. The insulation film 14 may be formed on the surface (e.g., outer peripheral surface) of the light emitting element LD so as to surround an outer peripheral surface of the active layer 12, and may further surround one area of the first and second semiconductor layers 11 and 13. In some embodiments, the insulation film 14 may not cover but expose respective one ends of the first semiconductor layer 11 and the second semiconductor layer 13 disposed at both ends of the light emitting element LD in the length L1 direction, for example, two base surface of a cylindrical shape (upper and lower surfaces of the light emitting element LD).

In some embodiments, the insulation film 14 may include at least one or more of insulating materials of a silicon oxide (SiOx), a silicon nitride (SiNx), a silicon oxynitride (SiOxNy), an aluminum oxide (AlOx), a titanium oxide (TiOx), a hafnium oxide (HfOx), a titanium strontium oxide (SrTiOx), a cobalt oxide (CoxOy), a magnesium oxide (MgO), a zinc oxide (ZnO), a ruthenium oxide (RuOx), a nickel oxide (NiO), a tungsten oxide (WOx), tantalum oxide (TaOx), a gadolinium oxide (GdOx), a zirconium oxide (ZrOx), a gallium oxide (GaOx), a vanadium oxide (VxOy), ZnO:Al, ZnO:B, InxOy:H, a niobium oxide (NbxOy), a fluorinated magnesium (MgFx), a fluorinated aluminum (AlFx), an alucone polymer film, a titanium nitride (TiN), a tantalum nitride (TaN), an aluminum nitride (AlNx), a gallium nitride (GaN), a tungsten nitride (WN), a hafnium nitride (HfN), a niobium nitride (NbN), gadolinium nitride (GdN), a zirconium nitride (ZrN), and a vanadium nitride (VN), but the present disclosure is not limited thereto, and various materials having insulating properties may be used as the material of the insulation film 14. That is, the material included in the insulation film 14 is not particularly limited, and the insulation film 14 may include currently known various insulating materials.

The insulation film 14 may be provided as a single film, or may be provided as a multi-film including at least a double film. For example, when the insulation film 14 is configured as a double film including a first layer and a second layer that are sequentially stacked, the first layer and the second layer may be made of different materials (or substances), and may be formed by different processes. In some embodiments, the first layer and the second layer may include the same material (or substance).

In some embodiments, the light emitting element LD may further include an additional component in addition to the first semiconductor layer 11, the active layer 12, the second semiconductor layer 13, and the insulation film 14. For example, the light emitting element LD may additionally include one or more of a phosphor layer, an active layer, a semiconductor layer, and/or an electrode disposed on one end side of the first semiconductor layer 11, the active layer 12, and the second semiconductor layer 13.

The electrode that may be disposed on one end side of the light emitting element LD may be an ohmic contact electrode or a Schottky contact electrode, but is not limited thereto. The electrode may include a metal or a metal oxide, and for example, Cr, Ti, Al, Au, Ni, ITO, IZO, ITZO, and an oxide thereof or an alloys thereof may be used alone or in combination therein. In some embodiments, the electrode may be substantially transparent or transflective. Accordingly, light generated by the light emitting element LD may pass through the electrode to be emitted to the outside of the light emitting element LD.

When the insulation film 14 is provided on a surface of the light emitting element LD, for example, a surface of the active layer 12, it is possible to prevent or protect the active layer 12 from being short-circuited with at least one electrode (for example, at least one of the contact electrodes connected to respective ends of the light emitting element LD). Therefore, electrical stability of the light emitting element LD may be secured.

In some embodiments, when the insulation film 14 is formed on the surface of the light emitting element LD, it is possible to improve life-span and efficiency thereof by reducing or minimizing surface defects of the light emitting element LD. In some embodiments, when the insulation film 14 is formed on each light emitting element LD, it is possible to prevent an unwanted short circuit between the light emitting elements LD from occurring even when a plurality of the light emitting elements LD are disposed in close contact with each other.

Further, in some embodiments, the light emitting element LD may be manufactured through a surface treatment process. For example, when a plurality of the light emitting elements LD are mixed with a fluid solution (or a solvent) and supplied to each light emitting area (for example, a light emitting area of each pixel), respective light emitting elements LD may be surface-treated so that the light emitting elements LD are not non-uniformly aggregated in the solution and are uniformly distributed.

Hereinafter, light emitting elements disposed in a display device according to an embodiment will be described with reference to FIG. 4, FIG. 5A, and FIG. 5B.

Figure 4:
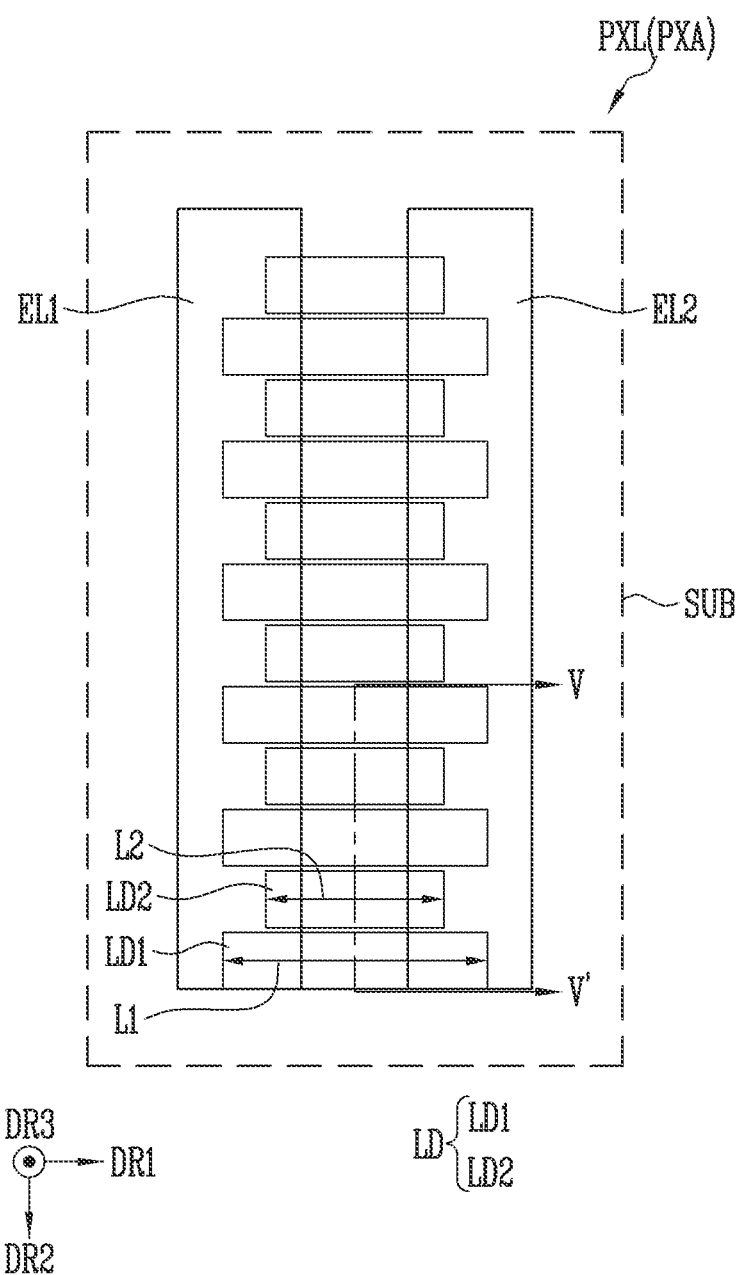
FIG. 4 illustrates a schematic top plan view of arrangement of light emitting elements in one pixel of a display device according to an embodiment.
Figure 5A:
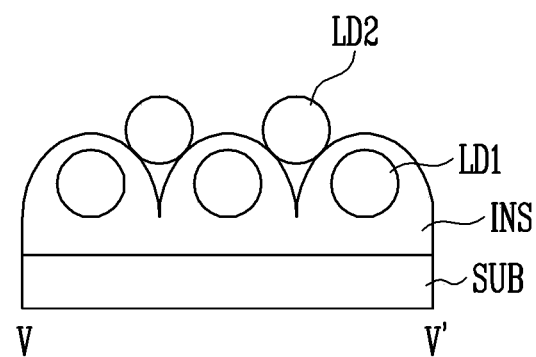
FIG. 5A and FIG. 5B illustrate cross-sectional views taken along the line V-V' of FIG. 4.
Figure 5B:
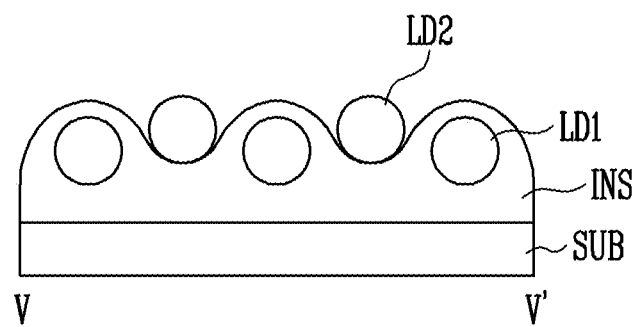

FIG. 4 illustrates a schematic top plan view of arrangement of light emitting elements in one pixel of a display device according to an embodiment, and FIG. 5A and FIG. 5B illustrate cross-sectional views taken along the line V-V' of FIG. 4.

One pixel PXL may be formed in a pixel area PXA that is a portion of the display area DA of the substrate SUB.

Referring to FIG. 4, one pixel PXL may include the first electrode EL1, the second electrode EL2, and the plurality of light emitting elements LD.

In some embodiments, the light emitting element LD may include a first light emitting element LD1 and a second light emitting element LD2 having different lengths. A length L2 of the second light emitting element LD2 may be shorter than a length L1 of the first light emitting element LD1. For example, the length L2 of the second light emitting element LD2 may be 2 µm or more shorter than the length L1 of the first light emitting element LD1.

The first electrode EL1 and the second electrode EL2 are spaced from each other in the first direction DR1 on the substrate SUB to be disposed side by side in the second direction DR2. The first electrode EU may correspond to the first electrode EL1 of FIG. 2 described above, and the second electrode EL2 may correspond to the second electrode EL2 of FIG. 2 described above.

A plurality of first light emitting elements LD1 and a plurality of second light emitting elements LD2 are disposed between the first electrode EL1 and the second electrode EL2.

The plurality of first light emitting elements LD1 may be spaced from each other to be disposed in the first direction DR1 (or a length direction of the first and second electrodes EL1 and EL2). In some embodiments, the plurality of second light emitting elements LD2 may be spaced from each other to be disposed in the first direction DR1 (or a length direction). That is, the second light emitting element LD2 may be disposed between the plurality of first light emitting elements LD1 spaced from each other in the second direction DR2. For example, one second light emitting element LD2 may be disposed between two first light emitting elements LD1 that are adjacent to each other in the second direction DR2.

After the plurality of first light emitting elements LD1 are disposed between the first electrode EU and the second electrode EL2, the plurality of second light emitting elements LD2 may be disposed in a different layer from the plurality of first light emitting elements LD1 between the first electrode EU and the second electrode EL2. The plurality of first light emitting elements LD1 and the plurality of second light emitting elements LD2 may each be aligned in the same direction, for example, in the first direction DR1 (or the length direction of the light emitting element), between the first electrode EL1 and the second electrode EL2. An alignment method of the first light emitting element LD1 and the second light emitting element LD2 will be described below in FIG. 8.

In FIG. 4, the first light emitting elements LD1 and the second light emitting elements LD2 are disposed so as to not overlap each other in a plan view, but the present disclosure is not limited thereto. In some embodiments, the first light emitting elements LD1 and the second light emitting elements LD2 may be disposed so that one surfaces thereof overlap each other.

Referring to FIG. 5A, an insulation layer INS is disposed between the first light emitting elements LD1 and the second light emitting elements LD2 in a cross-sectional view. Accordingly, the first light emitting elements LD1 and the second light emitting elements LD2 may be electrically insulated from each other.

The insulation layer INS is disposed to cover the first light emitting elements LD1. A surface of the insulation layer INS may be implemented in a curved shape to correspond to a surface of the first light emitting element LD1. In some embodiments, when viewed in a cross-sectional view, the surface of the insulation layer INS corresponds to the surface of the first light emitting element LD1 having a circular cylindrical shape to be realized in a semicircular shape, but the present disclosure is not limited thereto. In some embodiments, when the first light emitting element LD1 is implemented in a polygonal cylindrical shape, when viewed in a cross-sectional view, the surface of the insulation layer INS may be implemented in a polygonal shape.

The second light emitting elements LD2 are disposed on the insulation layer INS, and one second light emitting element LD2 is disposed between two first light emitting elements LD1. Accordingly, the second light emitting element LD2 may be disposed to correspond to a concave portion of the insulation layer INS covering the two adjacent first light emitting elements LD1.

Referring to FIG. 5B, the insulation layer INS is disposed between the first light emitting elements LD1 and the second light emitting elements LD2 in a cross-sectional view. Accordingly, the first light emitting elements LD1 and the second light emitting elements LD2 may be electrically insulated from each other.

The first light emitting elements LD1 are spaced from each other to be disposed on the substrate SUB.

The insulation layer INS is disposed to cover the first light emitting elements LD1 and the substrate SUB. A surface of the insulation layer INS may be implemented in a curved shape to correspond to a surface of the first light emitting element LD1.

The second light emitting elements LD2 are disposed on the insulation layer INS, and one second light emitting element LD2 is disposed between two first light emitting elements LD1. The second light emitting element LD2 may be disposed on the insulation layer INS covering the substrate SUB between the two adjacent first light emitting elements LD1. For example, one second light emitting element LD2 is disposed between the two adjacent first light emitting elements LD1 that are spaced from each other. Accordingly, the first light emitting elements LD1 and the second light emitting elements LD2 are electrically insulated from each other with the insulation layer INS therebetween, while they may be disposed at substantially the same height in a cross-sectional view.

In the display device according to embodiments of the present disclosure, the second light emitting element LD2 is disposed between the first light emitting elements LD1 with the insulation layer INS interposed therebetween, thereby increasing a density of the light emitting elements LD within the pixel PXL. Therefore, luminance of the display device may increase, and a life-span thereof may increase.

Hereinafter, a detailed structure of a display device according to an embodiment will be described with reference to FIG. 6 and FIG. 7.

Figure 6:
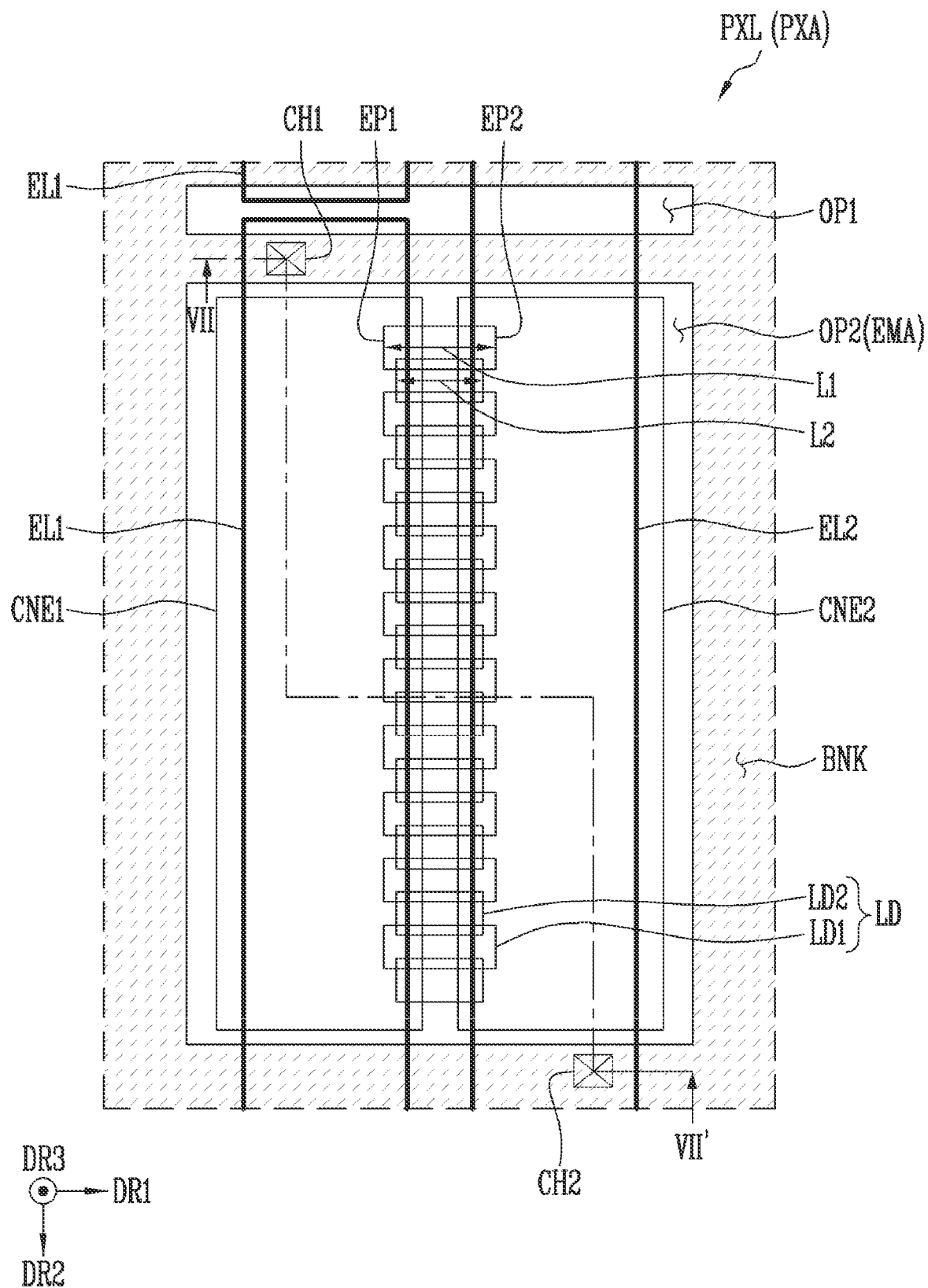
FIG. 6 illustrates a schematic top plan view of arrangement of one pixel of a display device according to an embodiment.
Figure 7:
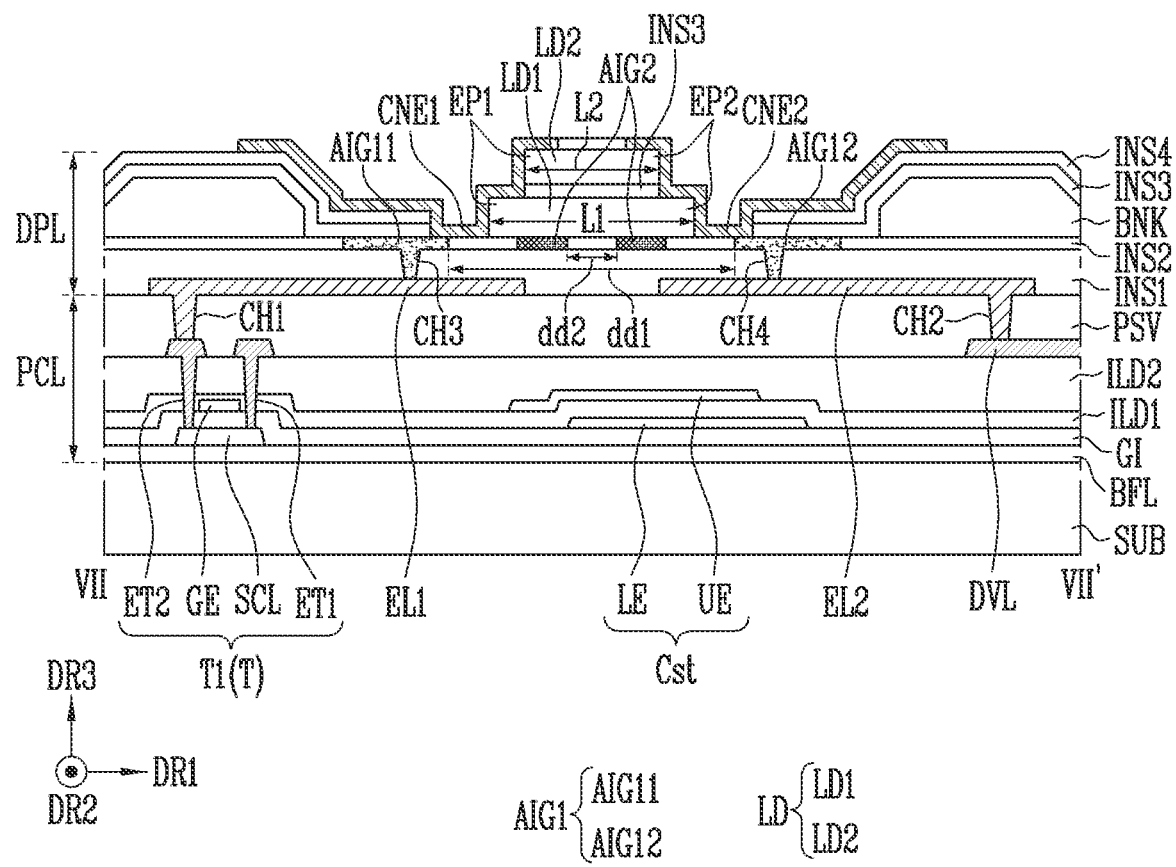
FIG. 7 illustrates a cross-sectional view taken along the line VII-VII' of FIG. 6.

FIG. 6 illustrates a schematic top plan view of arrangement of one pixel of a display device according to an embodiment, and FIG. 7 illustrates a cross-sectional view taken along the line VII-VII' of FIG. 6.

In FIG. 6, for convenience, transistors electrically connected to light emitting elements LD and signal lines electrically connected to transistors are omitted.

Referring to FIG. 6, each pixel PXL may be formed in the pixel area PXA provided in the display area DA of the substrate SUB. The pixel area PXA may include a light emitting area EMA, and a peripheral area that is a non-light emitting area excluding the light emitting area EMA.

Each pixel PXL may include a bank BNK disposed in the peripheral area. The bank BNK may be a structure that defines (or partitions) the pixel area PXA or light emitting area EMA of each of a corresponding pixel PXL and pixels adjacent thereto, and for example, may be a pixel defining film. In some embodiments, the bank BNK may be a pixel defining film or a dam structure that defines a region to which the light emitting elements LD should be supplied in a process of supplying light emitting elements LD to each pixel PXL. For example, the light emitting area of each pixel PXL is partitioned by the bank BNK, so that a mixed solution (for example, ink) including a target amount and/or type of light emitting element LD may be supplied to (or injected into) the light emitting area EMA.

The bank BNK may be configured to include at least one light blocking material and/or reflective material to prevent or reduce a light leakage defect that light leaks between the corresponding pixel PXL and pixels adjacent thereto. In some embodiments, the bank BNK may include a transparent material (or substance). The transparent material may include, for example, a polyamides resin, a polyimide resin, and the like, but the present disclosure is not limited thereto. According to another embodiment, a reflective material layer may be separately provided and/or formed on the bank BNK to further improve an efficiency of light emitted from each of the pixels PXL.

The bank BNK may include at least one or more of openings exposing components disposed under the bank BNK in the pixel area PXA. For example, the bank BNK may include a first opening OP1 and a second opening OP2 exposing components disposed under the bank BNK.

In some embodiments, the light emitting area EMA of each pixel PXL and the second opening OP2 of the bank BNK may correspond to each other. In the pixel area PXA, the first opening OP1 of the bank BNK may be disposed to be spaced from the second opening OP2, and may be disposed to be adjacent to one side (for example, upper or lower side) of the pixel area PXA. For example, the first opening OP1 of the bank BNK may be adjacent to the upper side of the pixel area PXA.

The pixel PXL may include the first electrode EL1, the second electrode EL2, a first contact electrode CNE1, a second contact electrode CNE2, and the light emitting element LD.

The first electrode EL1 and the second electrode EL2 are spaced from each other in the first direction DR1.

After the light emitting elements LD are supplied and aligned in the pixel area PXA between the first electrode EL1 and the second electrode EL2 during the manufacturing process of the display device, the first electrode EL1 may be separated from other electrodes (for example, a first electrode provided to each of the adjacent pixels PXL adjacent in the second direction DR2) in the first opening OP1. That is, the first opening OP1 of the bank BNK may be provided for a separation process for the first electrode EL1.

The first electrode EL1 may be electrically connected to the first transistor T1 described with reference to FIG. 2 through a first contact hole CH1, and the second electrode EL2 may be electrically connected to the second driving power source VSS (or the second power line PL2) described with reference to FIG. 2 through the second contact hole CH2.

The first contact electrode CNE1 is disposed so that a first end portion EP1 of each of the light emitting elements LD overlaps the first electrode EL1, and physically and/or electrically connect the first end portion EP1 and the first electrode EL1.

The second contact electrode CNE2 is disposed so that a second end portion EP2 of each of the light emitting elements LD overlaps the second electrode EL2, and physically and/or electrically connect the second end portion EP2 and the second electrode EL2.

The first contact electrode CNE1 and the second contact electrode CNE2 may have a bar shape extending along the second direction DR2 when viewed in a plan view, but the present disclosure is not limited thereto. In some embodiments, the shapes of the first contact electrode CNE1 and the second contact electrode CNE2 may be variously changed within a range in which they are electrically stably connected to each of the light emitting elements LD. In some embodiments, the shapes of the first contact electrode CNE1 and the second contact electrode CNE2 may be variously changed in consideration of a connection relationship between them and the first electrode EL1 and second electrode EL2 disposed thereunder, respectively.

In some embodiments, the light emitting elements LD include a plurality of first light emitting elements LD1 and a plurality of second light emitting elements LD2. The plurality of first light emitting elements LD1 and the plurality of second light emitting elements LD2 may be disposed between the first electrode EU the second electrode EL2.

The plurality of first light emitting element LD1 and the plurality of second light emitting element LD2 each include the first end portion EP1 (or one end portion) and the second end portion EP2 (or the other end portion) disposed at both ends thereof in the directions of the lengths L1 and L2. For example, the plurality of first light emitting elements LD1 may include the first end portion EP1 and the second end portion EP2 disposed at both ends thereof in the length L1 direction, and the plurality of second light emitting elements LD2 may include the first end portion EP1 and the second end portion EP2 disposed at both ends thereof in the length L2 direction.

The first end portion EP1 of each of the first and second light emitting elements LD1 and LD2 may overlap the first electrode EL1 to be connected to the first electrode EL1, and the second end portion EP2 of each of the first and second light emitting elements LD1 and LD2 overlaps the second electrode EL2 to be connected to the second electrode EL2. In some embodiments, the first end portion EP1 is not directly provided on the first electrode EL1, but may be electrically connected to the first electrode EL1 through at least one contact electrode (for example, the first contact electrode CNE1). In some embodiments, the second end portion EP2 of each of the first and second light emitting elements LD1 and LD2 is not directly provided on the second electrode EL2, but may be electrically connected to the second electrode EL2 through at least another contact electrode (for example, the second contact electrode CNE2).

The plurality of first light emitting elements LD1 and the plurality of second light emitting elements LD2 may be disposed so that one surfaces thereof overlap each other.

FIG. 6 illustrates the structure in which one surfaces of the plurality of first light emitting elements LD1 and the plurality of second light emitting elements LD2 are disposed to overlap each other in a plan view. The overlapping structure of the first light emitting element LD1 and the second light emitting element LD2 is shown in FIG. 7 in a cross-sectional view.

Referring to FIG. 7, the display device may include the substrate SUB, a pixel circuit layer PCL, and a display element layer DPL.

The substrate SUB may be a rigid substrate or a flexible substrate, and may include a transparent insulating material to transmit light.

The pixel circuit layer PCL may include a buffer layer BFL, at least one transistor T, at least one storage capacitor Cst, a driving voltage wire DVL, a plurality of insulation layers GI, ILD1, and ILD2, and a passivation layer PSV.

The buffer layer BFL may prevent impurities from being diffused into the transistor T included in the pixel circuit (see 'PXC' in FIG. 2). The buffer layer BFL may be an inorganic insulation film including an inorganic material. For example, the buffer layer BFL may include at least one of metal oxides such as a silicon nitride (SiNx), a silicon oxide (SiOx), a silicon oxynitride (SiOxNy), and an aluminum oxide (AlOx). The buffer layer BFL may be provided as a single film, or may be provided as a multi-film of a double or more of films. When the buffer layer BFL is provided as the multi-film, respective layers thereof may be made of the same material or different materials. The buffer layer BFL may be omitted depending on the material, a process condition, and the like of the substrate SUB.

The transistor T may include a driving transistor T1 for controlling a driving current of the light emitting elements LD and a switching transistor electrically connected to the driving transistor T1. However, the present disclosure is not limited thereto, and the pixel circuit layer PCL may further include circuit elements that perform other functions in addition to the driving transistor T1 and the switching transistor (e.g., transistor T2 of FIG. 2). The driving transistor T1 may be the first transistor T1 described with reference to FIG. 2, and the switching transistor may be the second transistor T2 described with reference to FIG. 2. In the following embodiment, the driving transistor T1 and the switching transistor (e.g., transistor T2 of FIG. 2) are may together be referred to as transistor T.

The transistor T may include a semiconductor pattern SCL, a gate electrode GE, a source electrode ET1, and a drain electrode ET2. In some embodiments, the source electrode ET1 and the drain electrode ET2 may be interchanged.

The semiconductor pattern SCL is disposed on the buffer layer BFL. The semiconductor pattern SCL may include a source region connected to the source electrode ET1, a drain region connected to the drain electrode ET2, and a channel region between the source region and the drain region. The channel region may overlap the gate electrode GE of the transistor T. The semiconductor pattern SCL may be a semiconductor pattern made of a poly silicon, an amorphous silicon, an oxide semiconductor, or the like.

The gate insulation layer GI is disposed on the semiconductor pattern SCL to cover the semiconductor pattern SCL and the buffer layer BFL. The gate insulation layer GI may be an inorganic insulation film including an inorganic material. For example, the gate insulation layer GI may include at least one of metal oxides such as a silicon nitride (SiNx), a silicon oxide (SiOx), a silicon oxynitride (SiOxNy), and an aluminum oxide (AlOx). In some embodiments, the gate insulation layer GI may be formed as an organic insulation film including an organic material. The gate insulation layer GI may be provided as a single film, or may be provided as a multi-film of a double or more of films.

The gate electrode GE is disposed on the gate insulation layer GI so as to correspond to the channel region of the semiconductor pattern SCL. The gate electrode GE may be configured of a single film made of a single or mixture thereof selected from a group consisting of copper (Cu), molybdenum (Mo), tungsten (W), aluminum neodymium (AlNd), titanium (Ti), aluminum (Al), silver (Ag), and an alloy thereof. In some embodiments, the gate electrode GE may be configured of a double film or multi-film structure of low-resistance materials such as molybdenum (Mo), titanium (Ti), copper (Cu), aluminum (Al), or silver (Ag).

A lower electrode LE is disposed at the same layer as the gate electrode GE of the driving transistor T1, and may include the same material as the gate electrode GE of the driving transistor T1.

The first interlayer insulation layer ILD1 is disposed on the lower electrode LE of the storage capacitor Cst to cover the gate insulation layer GI and the lower electrode LE of the storage capacitor Cst. The first interlayer insulation layer ILD1 may include the same material as that of the gate insulation layer GI, or may include one or more materials selected from the materials illustrated as constituent materials of the gate insulation layer GI.

The upper electrode UE is disposed at the first interlayer insulation layer ILD1, overlaps the lower electrode LE with the first interlayer insulation layer ILD1 interposed therebetween, and forms the storage capacitor Cst.

The second interlayer insulation layer ILD2 is disposed on an upper electrode UE so as to cover the first interlayer insulation layer ILD1 and the upper electrode UE. The second interlayer insulation layer ILD2 may be an inorganic insulation film including an inorganic material or an organic insulation film including an organic material. In some embodiments, the second interlayer insulation layer ILD2 may include the same material as the first interlayer insulation layer ILD1, but the present disclosure is not limited thereto. The second interlayer insulation layer ILD2 may be provided as a single film, and may be provided as a multi-film of a double or more of films.

The source electrode ET1 and the drain electrode ET2 of the of the driving transistor T1 may be disposed on the second interlayer insulation layer ILD2, and may be respectively connected to the source and drain regions of the semiconductor pattern SCL through contact holes sequentially passing through the gate insulation layer GI and the first and second interlayer insulation layers ILD1 and ILD2.

A driving voltage wire DVL is disposed on the second interlayer insulation layer ILD2. The driving voltage wire DVL may have the same configuration as the second power line PL2 described with reference to FIG. 2. Therefore, a voltage of the second driving power source VSS may be applied to the driving voltage wire DVL. In some embodiments, the pixel circuit layer PCL may further include a first power line connected to the first driving power source VDD. The first power line may be electrically connected to one configuration of the display element layer DPL, for example, to the first electrode EL1, and the driving voltage wire DVL may be electrically connected to the other configuration of the display element layer DPL, for example, to the second electrode EL2.

In some embodiments, it has been described that the driving voltage wire DVL is disposed at the same layer as the source electrode ET1 and drain electrode ET2 of the transistor T, but the present disclosure is not limited thereto. In some embodiments, the driving voltage wire DVL may be disposed at the same layer as one of conductive layers provided in the pixel circuit layer PCL.

The passivation layer PSV is disposed on the second interlayer insulation layer ILD2 to cover the transistor T, the driving voltage wire DVL, and the second interlayer insulation layer ILD2. The passivation layer PSV may include an organic insulation film and/or an inorganic insulation film. The inorganic insulation film may include at least one of metal oxides such as a silicon oxide (SiOx), a silicon nitride (SiNx), a silicon oxynitride (SiOxNy), and an aluminum oxide (AlOx). The organic insulation film may be at least one of a polyacrylates resin, an epoxy resin, a phenolic resin, a polyamides resin, a polyimides rein, an unsaturated polyesters resin, a poly-phenylene ethers resin, a poly-phenylene sulfides resin, and a benzocyclobutene resin.

The passivation layer PSV includes the first contact hole CH1 exposing the drain electrode ET2 of the driving transistor T1 and the second contact hole CH2 exposing the driving voltage wire DVL.

The display element layer DPL is disposed on the passivation layer PSV.

The display element layer DPL may include the first electrode EL1, the second electrode EL2, the bank BNK, a first alignment electrode AIG1, a second alignment electrode AIG2, the light emitting element LD, the first contact electrode CNE1, the second contact electrode CNE2, and a plurality of insulation layers INS1, INS2, INS3, and INS4.

The first electrode EL1 and the second electrode EL2 are disposed on the passivation layer PSV. Each of the first electrode EL1 and the second electrode EL2 may be made of a material having a suitable reflectance (e.g., a set or predetermined reflectance) in order to direct light emitted from the light emitting element LD in an image display direction of the display device (for example, the third direction DR3). For example, each of the first electrode EL1 and the second electrode EL2 may be configured as a single film including a conductive oxide such as an indium tin oxide (ITO), an indium zinc oxide (IZO), a zinc oxide (ZnO), an indium gallium zinc oxide (IGZO), or an indium tin zinc oxide (ITZO), and a conductive polymer such as poly(3,4-ethylenedioxythiophene (PEDOT). In some embodiments, each of the first electrode EL1 and the second electrode EL2 may be configured as a multi-film further including a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), or an alloy thereof.

The first electrode EL1 may be physically and/or electrically connected to the drain electrode ET2 of the transistor T through the first contact hole CH1 of the passivation layer PSV. The second electrode EL2 may be physically and/or electrically connected to the driving voltage wire DVL through the second contact hole CH2 of the passivation layer PSV.

The first insulation layer INS1 is disposed on the first electrode EL1 and the second electrode EL2 to cover the first electrode EL1, the second electrode EL2, and the passivation layer PSV. The first insulation layer INS1 may include an inorganic insulation film made of an inorganic material or an organic insulation film made of an organic material. For example, the first insulation layer INS1 may include at least one of metal oxides such as a silicon nitride (SiNx), a silicon oxide (SiOx), a silicon oxynitride (SiOxNy), and an aluminum oxide (AlOx), but the present disclosure is not limited thereto. The first insulation layer INS1 may be formed as an inorganic insulation film that is suitable for protecting the light emitting elements LD from the pixel circuit layer PCL.

The first alignment electrode AIG1 and the second alignment electrode AIG2 are disposed on the first insulation layer INS1.

The first alignment electrode AIG1 is for aligning the first light emitting element LD1, and includes a first sub-alignment electrode AIG11 and a second sub-alignment electrode AIG12. A voltage for aligning the first light emitting element LD1 may be applied to the first alignment electrode AIG1.

The first end portion EP1 and the second end portion EP2 of the first light emitting element LD1 may be disposed to be directed to the first sub-alignment electrode AIG11 and the second sub-alignment electrode AIG12. For example, the first end portion EP1 of the first light emitting element LD1 may be disposed to be directed to the first sub-alignment electrode AIG11, and the second end portion EP2 of the first light emitting element LD1 may be disposed to be directed to the second sub-alignment electrode AIG12. The first light emitting element LD1 may be disposed to at least partially overlap the first sub-alignment electrode AIG11 and the second sub-alignment electrode AIG12 in the third direction DR3. However, the present disclosure is not limited thereto, and in some embodiments, the first light emitting element LD1 may be disposed so as to not overlap the first sub-alignment electrode AIG11 and the second sub-alignment electrode AIG12 when viewed in a cross-sectional view.

In some embodiments, a distance dd1 between the first sub-alignment electrode AIG11 and the second sub-alignment electrode AIG12 may be longer than the length L1 of the first light emitting element LD1, but the present disclosure is not limited thereto.

The first sub-alignment electrode AIG11 is physically and/or electrically connected to the first electrode EL1 through a third contact hole CH3 of the first insulation layer INS1. In some embodiments, the second sub-alignment electrode AIG12 is physically and/or electrically connected to the second electrode EL2 through a fourth contact hole CH4. Accordingly, the voltage of the first driving power supply source (VDD in FIG. 2) may be applied to the first sub-alignment electrode AIG11, and the voltage of the second driving power supply source (VSS in FIG. 2) may be applied to the second sub-alignment electrode AIG12.

The second alignment electrode AIG2 is for aligning the second light emitting element LD2, and is disposed between the first sub-alignment electrode AIG11 and the second sub-alignment electrode AIG12 in the first direction DR1. The second alignment electrode AIG2 may be configured of two second alignment electrodes AIG2, the two second alignment electrodes AIG2 are spaced from each other in first direction DR1, and each of the second alignment electrodes AIG2 is spaced from the first sub-alignment electrode AIG11 and the second sub-alignment electrode AIG12.

A voltage for aligning the second light emitting element LD2 may be applied to the two second alignment electrodes AIG2.

The first end portion EP1 and the second end portion EP2 of the second light emitting element LD2 may be disposed toward the two second alignment electrodes AIG2. When viewed in a cross-sectional view, the second light emitting element LD2 may be disposed to at least partially overlap the two second alignment electrodes AIG2 in the third direction DR3. However, the present disclosure is not limited thereto, and in some embodiments, the second light emitting element LD2 may not overlap the two second alignment electrodes AIG2. In some embodiments, a distance dd2 between the two second alignment electrodes AIG2 may be equal to or shorter than the length L2 of the second light emitting element LD2. In some embodiments, a distance dd2 between the two second alignment electrodes AIG2 may be larger than the length L1 of the first light emitting element LD1, but the present disclosure is not limited thereto.

In some embodiments, the second alignment electrode AIG2 may be omitted, while the second light emitting element LD2 may be aligned by applying an alignment voltage (or alignment signal) to the first alignment electrode AIG1. In some embodiments, the second alignment electrode AIG2 may be disposed to directly contact a lower portion of the second light emitting element LD2. This structure will be described with reference to FIG. 15 below.

The second insulation layer INS2 is disposed on the first insulation layer INS1 to cover the first insulation layer INS1. The second insulation layer INS2 may be partially opened so that front surfaces (or upper surfaces) of the first alignment electrode AIG1 and the second alignment electrode AIG2 may be exposed. The second insulation layer INS2 may include an inorganic insulation film made of an inorganic material or an organic insulation film made of an organic material. For example, the second insulation layer INS2 may include at least one of metal oxides such as a silicon nitride (SiNx), a silicon oxide (SiOx), a silicon oxynitride (SiOxNy), and an aluminum oxide (AlOx), but the present disclosure is not limited thereto. In some embodiments, the second insulation layer INS2 may be formed as an organic insulation film that is suitable for flattening the support surfaces of the first light emitting elements LD1.

The bank BNK is disposed on the second insulation layer INS2. In a process of supplying the light emitting elements LD to the light emitting area EMA, the bank BNK may be a dam structure that prevents a solution mixed with the light emitting elements LD from flowing into the light emitting area EMA of the adjacent pixel PXL, or controls an amount (e.g., a set or predetermined amount) of solution to be supplied to each light emitting area EMA.

The first light emitting element LD1 is disposed on the second insulation layer INS2. The first light emitting element LD1 may be disposed on the second insulation layer INS2 between the banks BNK so as to be parallel to the first direction DR1, which is the length L1 direction thereof. The first light emitting element LD1 may be disposed so as to overlap the second alignment electrode AIG2, and the first end portion EP1 and the second end portion EP2 of the first light emitting element LD1 may be disposed so as to deviate from (or not overlap) edges of the two second alignment electrodes AIG2.

The third insulation layer INS3 is disposed on the first light emitting element LD1, the first alignment electrode AIG1, the second insulation layer INS2, and the bank BNK. The third insulation layer INS3 may be partially opened to expose portions of surfaces of the first light emitting element LD1, the first alignment electrode AIG1, and the second insulation layer INS2.

The third insulation layer INS3 may partially cover the surface of the first light emitting element LD1. Accordingly, the first end portion EP1 and the second end portion EP2 of the first light emitting element LD1 may be exposed to be physically and/or electrically connected to the first contact electrode CNE1 and the second contact electrode CNE2, respectively. In some embodiments, the third insulation layer INS3, which partially covers an upper surface of the first light emitting element LD1, fixes the first light emitting element LD1 after the first light emitting element LD1 is aligned, so that it is possible to prevent the first light emitting element LD1 from deviating from an aligned position.

Because the third insulation layer INS3 may partially cover the upper surface of the first alignment electrode AIG1, the exposed upper surfaces of the first sub-alignment electrode AIG11 and the second sub-alignment electrode AIG12 may be physically and/or electrically connected to the first contact electrode CNE1 and the second contact electrode CNE2, respectively. In some embodiments, the third insulation layer INS3 may be disposed to cover a portion of the upper surface of the first light emitting element LD1.

The third insulation layer INS3 may be formed as a single film or multi-film, and may include an inorganic insulation film including at least one inorganic material or an organic insulation film including at least one organic material.

The second light emitting element LD2 is disposed on the third insulation layer INS3. The second light emitting element LD2 may be disposed so as to overlap the second alignment electrode AIG2, and the first end portion EP1 and the second end portion EP2 of the second light emitting element LD2 may deviate from the edges of the two second alignment electrodes AIG2. In other embodiments, the first end portion EP1 and the second end portion EP2 of the second light emitting element LD2 may not overlap from the edges of the two second alignment electrodes AIG2. In some embodiments, the first end portion EP1 and the second end portion EP2 of the second light emitting element LD2 may coincide with edge of the third insulation layer INS3 disposed on the upper surface of the first light emitting element LD1, but the present disclosure is not limited thereto.

The fourth insulation layer INS4 is disposed on the third insulation layer INS3 and the second light emitting element LD2. The fourth insulation layer INS4 may be partially opened so that a portion of a surface of the second light emitting element LD2 is exposed. Accordingly, the first end portion EP1 and the second end portion EP2 of the first light emitting element LD1 may be physically and/or electrically connected to the first contact electrode CNE1 and the second contact electrode CNE2, respectively.

An edge of the fourth insulation layer INS4 disposed on the third insulation layer INS3 may coincide with the edge of the third insulation layer INS3. Accordingly, the third insulation layer INS3 and the fourth insulation layer INS4 expose an upper surface of the first alignment electrode AIG1, so that the first alignment electrode AIG1 may be physically and/or electrically connected to the first contact electrode CNE1 and the second contact electrode CNE2.

The fourth insulation layer INS4 may be formed as a single film or multi-film, and may include an inorganic insulation film including at least one inorganic material or an organic insulation film including at least one organic material.

The first contact electrode CNE1 is disposed on the first alignment electrode AIG1, the first light emitting element LD1, and the second light emitting element LD2. For example, the first contact electrode CNE1 contacts a portion of an upper surface of the first sub-alignment electrode AIG11, the first end portion EP1 of the first light emitting element LD1, the first end portion EP1 of the second light emitting element LD2, a portion of the third insulation layer INS3, and a portion of the fourth insulation layer INS4.

The first contact electrode CNE1 may transmit the voltage of the first driving power source (VDD in FIG. 2) from the first sub-alignment electrode AIG11 to the first end portion EP1 of the first light emitting element LD1 and the first end portion EP1 of the second light emitting element LD2.

The second contact electrode CNE2 is disposed on the first alignment electrode AIG1, the first light emitting element LD1, and the second light emitting element LD2. For example, the second contact electrode CNE2 contacts a portion of an upper surface of the second sub-alignment electrode AIG12, the second end portion EP2 of the first light emitting element LD1, the second end portion EP2 of the second light emitting element LD2, a portion of the third insulation layer INS3, and a portion of the fourth insulation layer INS4.

The second contact electrode CNE2 may transmit the voltage of the second driving power source (VSS in FIG. 2) from the second sub-alignment electrode AIG2 to the second end portion EP2 of the first light emitting element LD1 and the second end portion EP2 of the second light emitting element LD2.

The first contact electrode CNE1 and the second contact electrode CNE2 may be made of various transparent conductive materials so that the light emitted from the first light emitting element LD1 and the second light emitting element LD2 and reflected by the first sub-alignment electrode AIG11 and the second sub-alignment electrode AIG12 proceeds in the image display direction of the display device (for example, in the third direction DR3) without a significant loss. For example, the first contact electrode CNE1 and the second contact electrode CNE2 may at least one of various transparent conductive materials (or substances) such as an indium tin oxide (ITO), an indium zinc oxide (IZO), a zinc oxide (ZnO), an indium gallium zinc oxide (IGZO), and an indium tin zinc oxide (ITZO), and may be formed to be substantially transparent or translucent to satisfy a light transmittance (e.g., a set or predetermined light transmittance) (or transmittance). However, the material of the first contact electrode CNE1 and the second contact electrode CNE2 is not limited to the above-described embodiment. In some embodiments, the first contact electrode CNE1 and the second contact electrode CNE2 may be made of various opaque conductive materials (or substances). The first contact electrode CNE1 and the second contact electrode CNE2 may be formed as a single film or multi-film.

The first contact electrode CNE1 and the second contact electrode CNE2 may be provided at the same layer with each other. In this case, the first contact electrode CNE1 and the second contact electrode CNE2 may be formed by using the same conductive material in the same process, but the present disclosure is not limited thereto. In some embodiments, the first contact electrode CNE1 and the second contact electrode CNE2 may be formed by different processes and provided in different layers from each other.

Although not shown, an insulation layer may be disposed on the first contact electrode CNE1 and the second contact electrode CNE2. The insulation layer may be an inorganic insulation film including an inorganic material or an organic insulation film including an organic material. For example, the insulation layer may have a structure in which at least one inorganic insulation film and at least one organic insulation film are alternately stacked. The insulation layer may entirely cover the display element layer DPL to block moisture or moisture from the outside from being introduced into the display element layer DPL including the light emitting elements LD.

In some embodiments, the display element layer DPL may be configured to selectively further include an optical layer in addition to the insulation layer. As an example, the display element layer DPL may further include a color conversion layer including color conversion particles that convert light emitted from the light emitting elements LD into light of a specific color.

According to another embodiment, at least one overcoat layer (for example, a layer flattening the upper surface of the display element layer DPL) may be further disposed on the insulation layer.

Hereinafter, a manufacturing method of the display device of FIG. 7 will be specifically described with reference to FIG. 8-FIG. 14.

Figure 12:
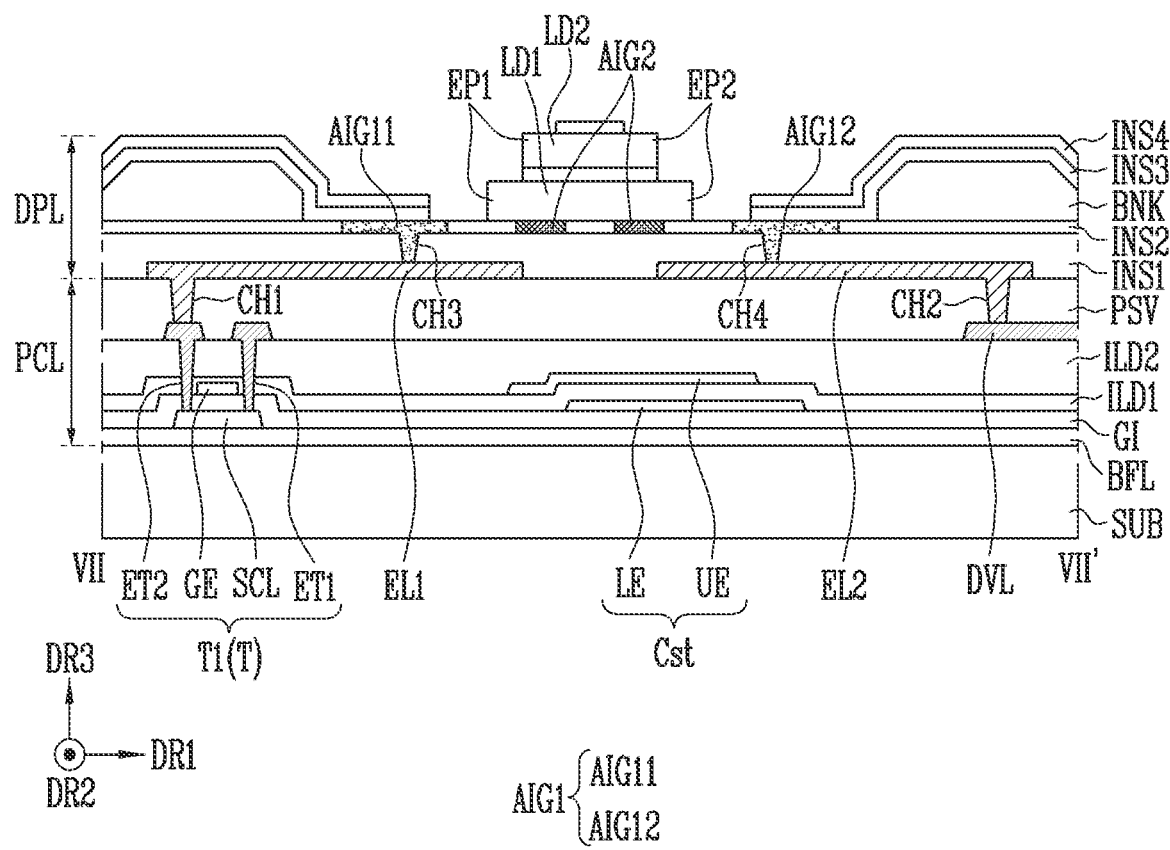
Figure 13:
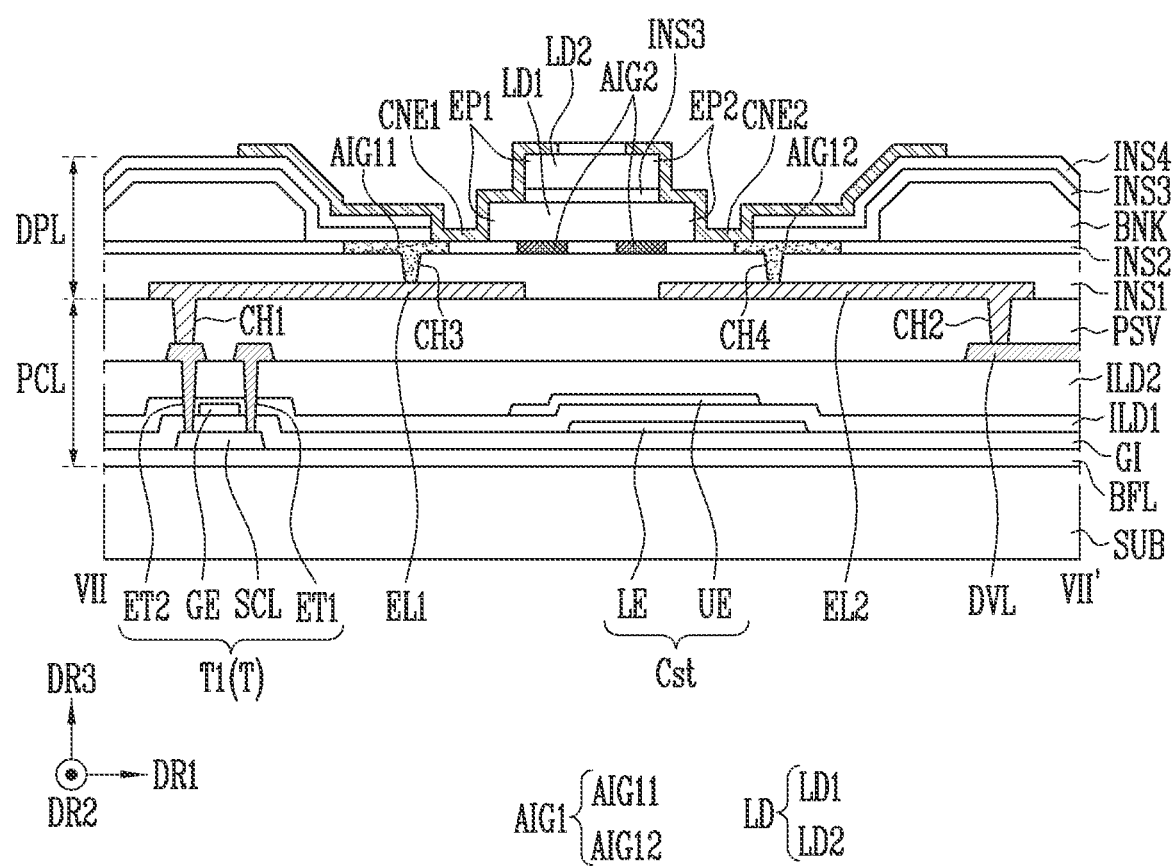
Figure 14:
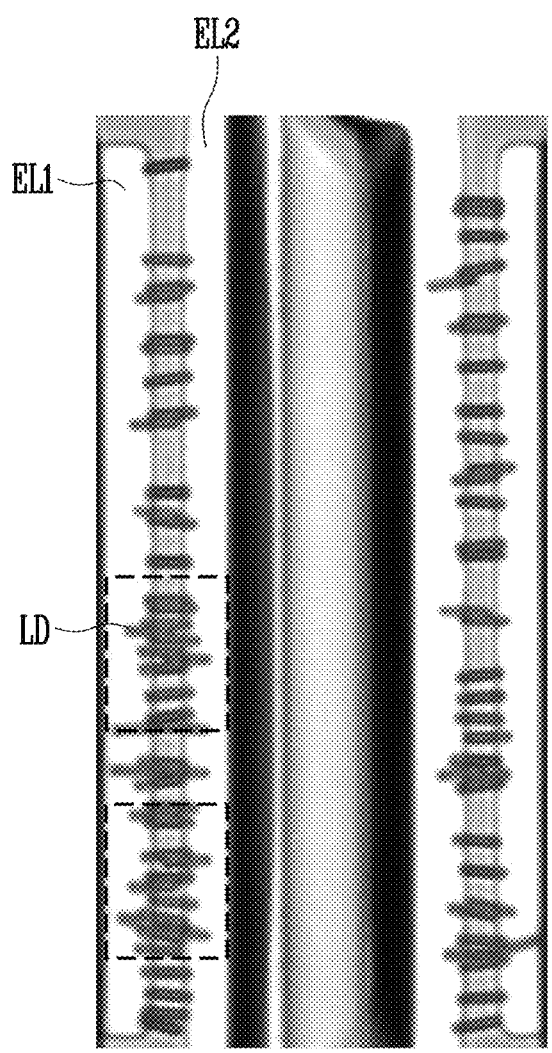
FIG. 14 illustrates a partial image of a pixel in which light emitting elements are aligned during manufacturing of a display device according to a comparative example.

FIG. 8-FIG. 13 are cross-sectional views sequentially showing a manufacturing method of a display device according to an embodiment, and FIG. 14 is a partial image of a pixel in which light emitting elements are aligned during manufacturing of a display device according to a comparative example.

Because FIG. 8-FIG. 13 refer to FIG. 7, contents overlapping those described in FIG. 7 are omitted.

Figure 8:
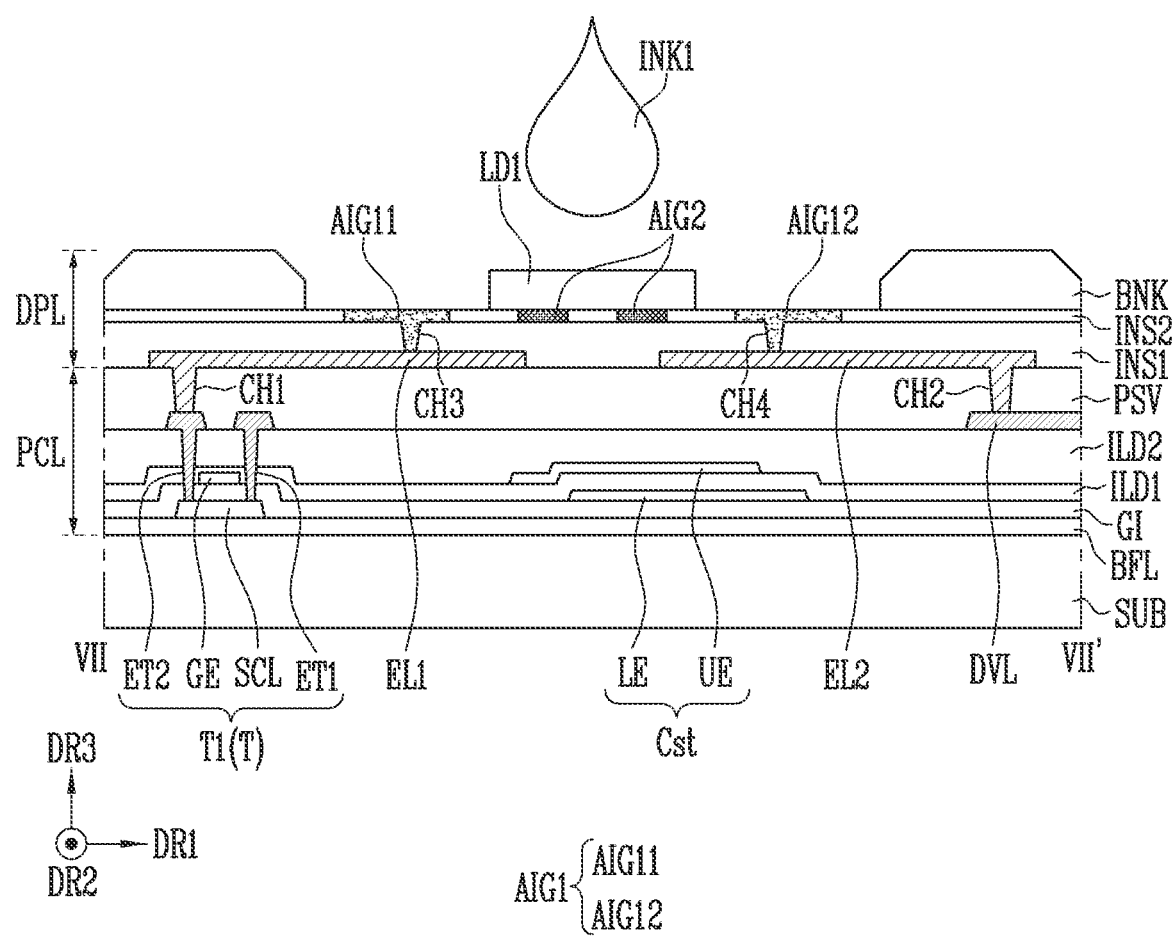
FIG. 8-FIG. 13 illustrate sequential cross-sectional views of a manufacturing method of a display device according to an embodiment.

First, referring to FIG. 8, the substrate SUB in which the pixel circuit layer PCL and the display element layer DPL are partially formed on an upper surface thereof is provided. The pixel circuit layer PCL is formed on the substrate SUB, and the first insulation layer INS1, the second insulation layer INS2, the first alignment electrode AIG1, the second alignment electrode AIG2, and the bank BNK are formed on the pixel circuit layer PCL.

In order to form the first light emitting element LD1 on the display element layer DPL, a first ink INK1 (e.g., a set or predetermined first ink INK1) is sprayed onto a partial area in which the first sub-alignment electrode AIG11 and the second sub-alignment electrode AIG12 overlap.

The first ink INK1 may include a solvent and a solid content, and the solid content may include a plurality of first light emitting elements LD1. For example, the solvent is made of acetone, water, alcohol, PGMEA (propylene glycol methyl ether acetate), toluene, and the like, and may be a material that is vaporized or volatilized at room temperature or by heat. The first ink INK1 may be sprayed by inkjet printing.

After the first ink INK1 is sprayed, when an alignment voltage (a set or predetermined alignment voltage) (or alignment signal) is applied to the first sub-alignment electrode AIG11 and the second sub-alignment electrode AIG12, as an electric field is formed between the first sub-alignment electrode AIG11 and the second sub-alignment electrode AIG12, the plurality of first light emitting elements LD1 are aligned between the first sub-alignment electrode AIG11 and the second sub-alignment electrode AIG12. The plurality of first light emitting elements LD1 may be disposed to be spaced from each other in the second direction DR2 as shown in FIG. 4 and FIG. 6 described above, when viewed in a plan view.

After the first light emitting elements LD1 are aligned, it is possible to stably arrange the first light emitting elements LD1 between the first sub-alignment electrode AIG11 and the second sub-alignment electrode AIG12 by volatilizing the first ink INK1 or by removing it with another method.

In some embodiments, the first ink INK1 including the plurality of first light emitting elements LD1 may be sprayed so that only about ½ of the first light emitting elements LD1 are disposed between the first sub-alignment electrode AIG11 and the second sub-alignment electrode AIG12 compared to a comparative example. In contrast, in the comparative example, the first ink INK1 including the plurality of first light emitting elements LD1 may be sprayed to entirely fill a space between the first sub-alignment electrode AIG11 and the second sub-alignment electrode AIG12. Therefore, in the comparative example, when the first light emitting elements LD1 are aligned, aggregation may occur in some areas. Referring to FIG. 14, an image in which the light emitting elements LD are aggregated in some areas can be seen.

In some embodiments, the number of the first light emitting elements LD1 included in the first ink INK1 may be smaller than the number of the first light emitting elements LD1 included in the first ink INK1 according to the comparative example. In this case, in some embodiments, when the first ink INK1 is sprayed and the first light emitting elements LD1 are aligned between the first sub-alignment electrode AIG11 and the second sub-alignment electrode AIG12, an interval between each first light emitting element LD1 and the first light emitting element LD1 adjacent thereto may be sufficiently secured. Therefore, in some embodiments, the aggregation of light emitting elements LD may be improved compared to the comparative example.

Figure 9:
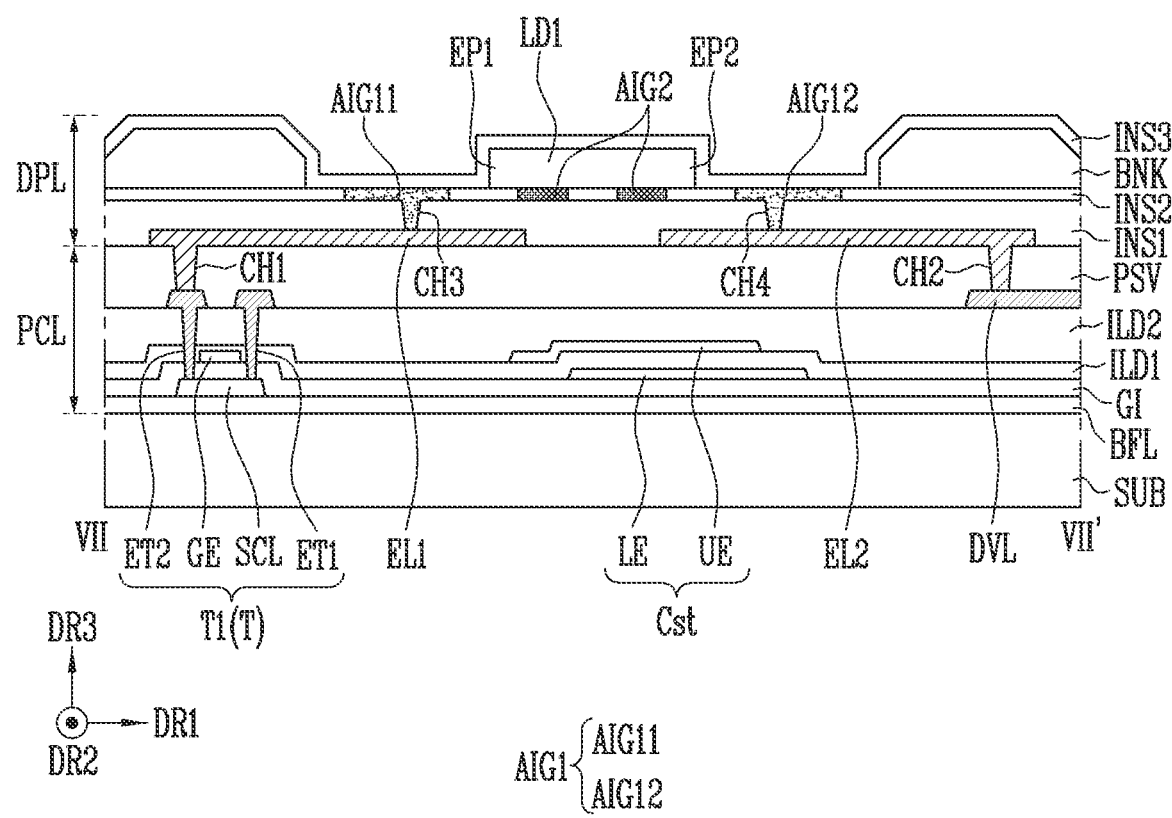

Referring to FIG. 9, the third insulation layer INS3 is formed to cover the surfaces of the first light emitting element LD1 aligned between the first sub-alignment electrode AIG11 and the second sub-alignment electrode AIG12, the first sub-alignment electrode AIG11, the second sub-alignment electrode AIG12, the bank BNK, and the second insulation layer INS2.

Figure 10:
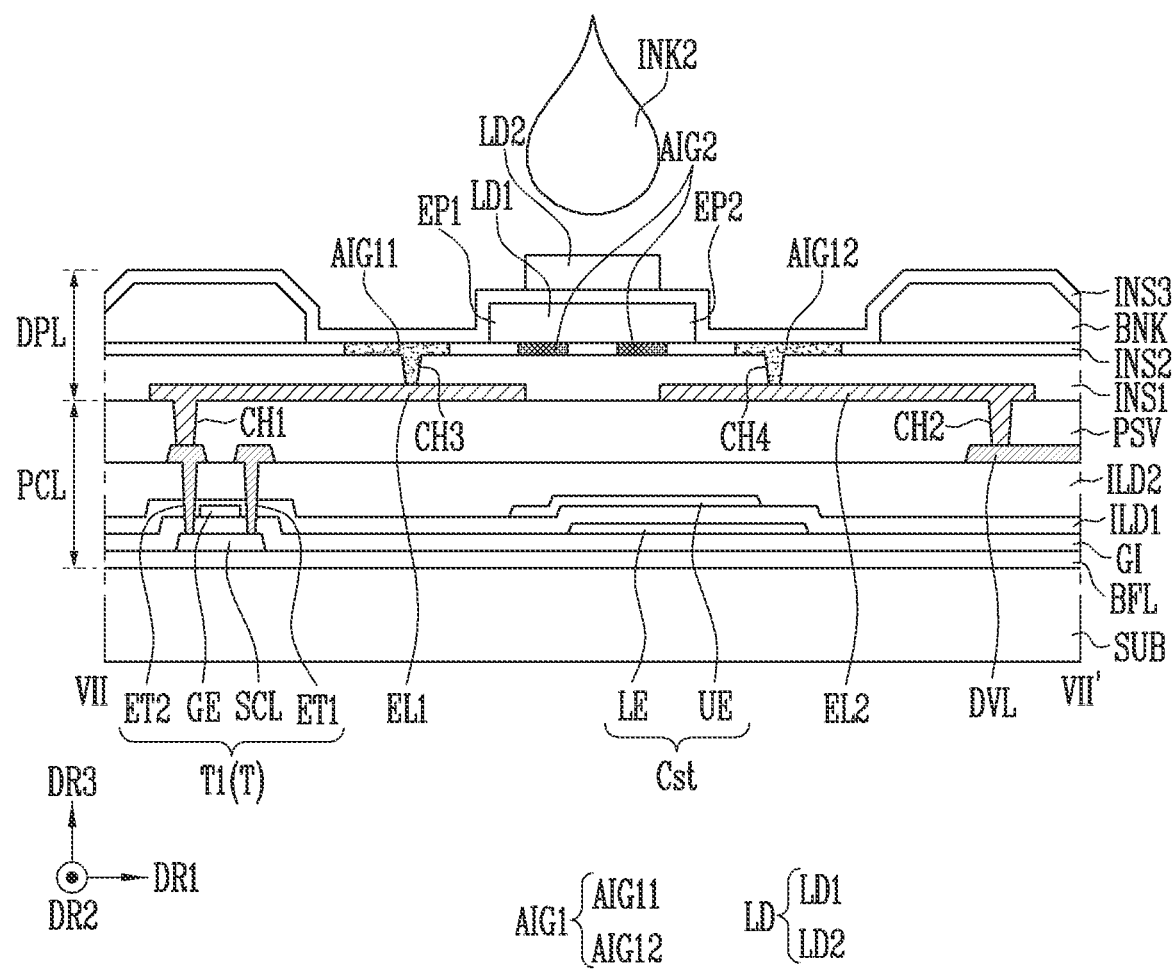

Referring to FIG. 10, a second ink INK2 is sprayed on the third insulation layer INS3 corresponding to the upper surface of the first light emitting element LD1. The second ink INK2 may be sprayed to overlap a corresponding area between two second alignment electrodes AIG2.

The second ink INK2 may include a solvent and a solid content, and the solid content may include a plurality of second light emitting elements LD2. For example, the solvent is made of acetone, water, alcohol, PGMEA (propylene glycol methyl ether acetate), toluene, and the like, and may be a material that is vaporized or volatilized at room temperature or by heat. The second ink INK2 may be sprayed by inkjet printing.

After the second ink INK2 is sprayed, when an alignment voltage (e.g., a set or predetermined alignment voltage) (or alignment signal) is applied to the two second alignment electrodes AIG2, as an electric field is formed between the two second alignment electrodes AIG2, the second light emitting elements LD2 are aligned on one area of the third insulation layer INS3 corresponding to the two second alignment electrodes AIG2. After the second light emitting elements LD2 are aligned, it is possible to stably arrange the second light emitting elements LD2 between the two second alignment electrodes AIG2 by volatilizing the second ink INK2 or by removing it with another method.

The second light emitting element LD2 may be formed on a different layer from the first light emitting element LD1, with the third insulation layer INS3 interposed therebetween. In FIG. 10, it is shown that the second light emitting element LD2 is formed to overlap the first light emitting element LD1 in a cross-sectional view, but referring to FIG. 4, FIG. 5A, and FIG. 5B described above, one second light emitting element LD2 may be formed between two first light emitting elements LD1. That is, one second light emitting element LD2 may be disposed to correspond to a concave portion of the third insulation layer INS3 covering the two first light emitting elements LD1.

In some embodiments, the second light emitting elements LD2 having the same number as that of the first light emitting elements LD1 may be disposed between the two second alignment electrodes AIG2. For example, the second ink INK2 including the plurality of second light emitting elements LD2 may be sprayed so that only about ½ of the second light emitting elements LD2 are disposed between the two second alignment electrodes AIG2 compared to the comparative example. In some embodiments, the light emitting elements LD may be arranged by primarily and secondarily spraying the solution.

In contrast, in the comparative example, because the solution including the plurality of light emitting elements LD may be sprayed once, when the light emitting elements LD are aligned, aggregation may occur in some areas. Referring to FIG. 14, an image in which the light emitting elements LD are aggregated in some areas can be seen.

In some embodiments, because the first ink INK1 including the first light emitting elements LD1 and the second ink INK2 including the second light emitting elements LD2 are sprayed in separate steps, after the first ink INK1 and the second ink INK2 are respectively sprayed, when the first light emitting elements LD1 and the second light emitting elements LD2 are aligned, the aggregation of the light emitting elements LD may be improved compared to the comparative example.

Figure 11:
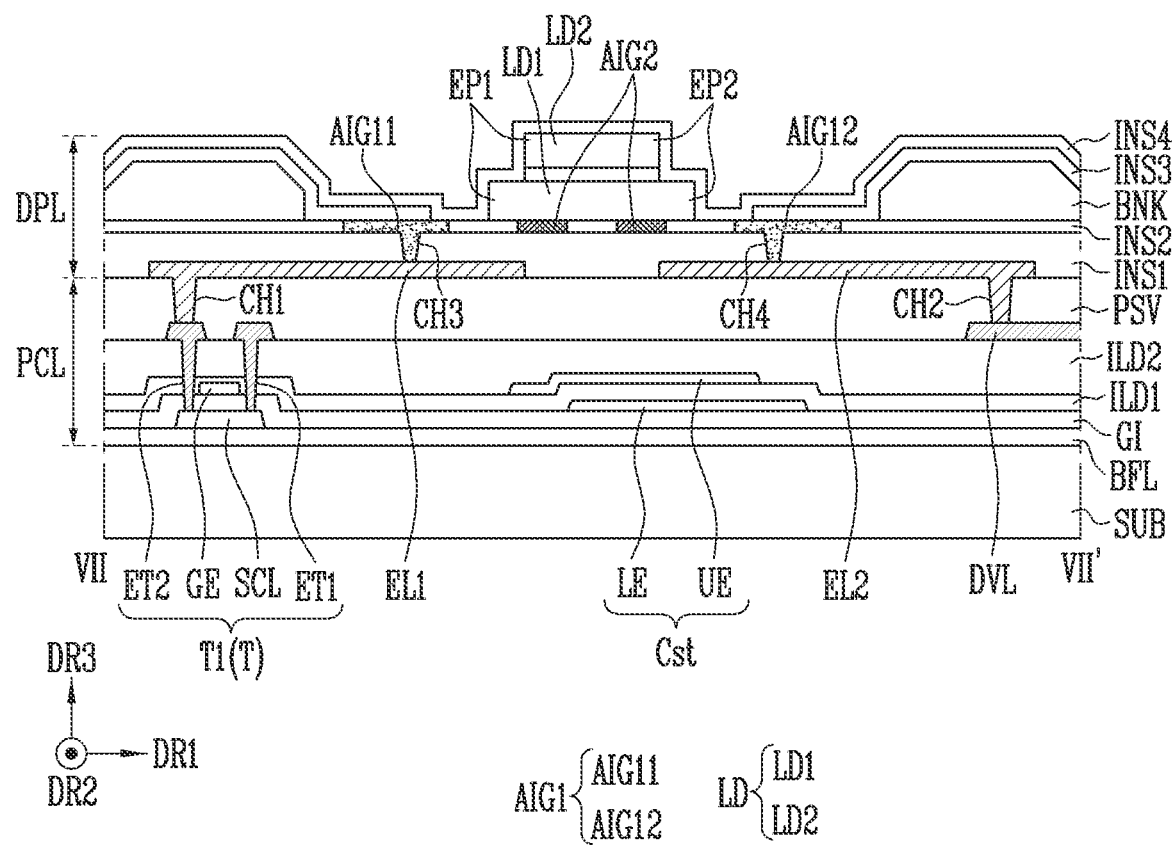

Referring to FIG. 11, the fourth insulation layer INS4 is formed to cover entire surfaces of the third insulation layer INS3 and the second light emitting element LD2.

Referring to FIG. 12, the third insulation layer INS3 and the fourth insulation layer INS4 are partially opened. The third insulation layer INS3 and the fourth insulation layer INS4 may be removed by a photo lithography process or the like. Areas in which the third insulation layer INS3 and the fourth insulation layer INS4 are removed may correspond to areas in which the first contact electrode CNE1 and the second contact electrode CNE2 to be described later are disposed.

The surfaces of the first alignment electrode AIG1, the first light emitting element LD1, and the second light emitting element LD2 are partially exposed by openings of the third insulation layer INS3 and the fourth insulation layer INS4.

Referring to FIG. 13, in the area from which the third insulation layer INS3 and the fourth insulation layer INS4 are removed, the first contact electrode CNE1 and the second contact electrode CNE2 are formed.

The first contact electrode CNE1 may be formed to contact a portion of an upper surface of the first sub-alignment electrode AIG11, the first end portion EP1 of the first light emitting element LD1, the first end portion EP1 of the second light emitting element LD2, a portion of the third insulation layer INS3, and a portion of the fourth insulation layer INS4.

The second contact electrode CNE2 may be formed to contact a portion of an upper surface of the second sub-alignment electrode AIG12, the second end portion EP2 of the first light emitting element LD1, the second end portion EP2 of the second light emitting element LD2, a portion of the third insulation layer INS3, and a portion of the fourth insulation layer INS4.

As described above, according to the display device of the embodiments of the present disclosure, because the first light emitting elements LD1 and the second light emitting elements LD2 are arranged through a primary inkjet printing process and a secondary inkjet printing process, respectively, it is possible to improve the aggregation of the light emitting elements, compared with the performing of only the inkjet printing process once. Therefore, it is possible to improve emission efficiency of the display device.

Hereinafter, another structure of a display device according to an embodiment will be described with reference to FIG. 15.

Figure 15:
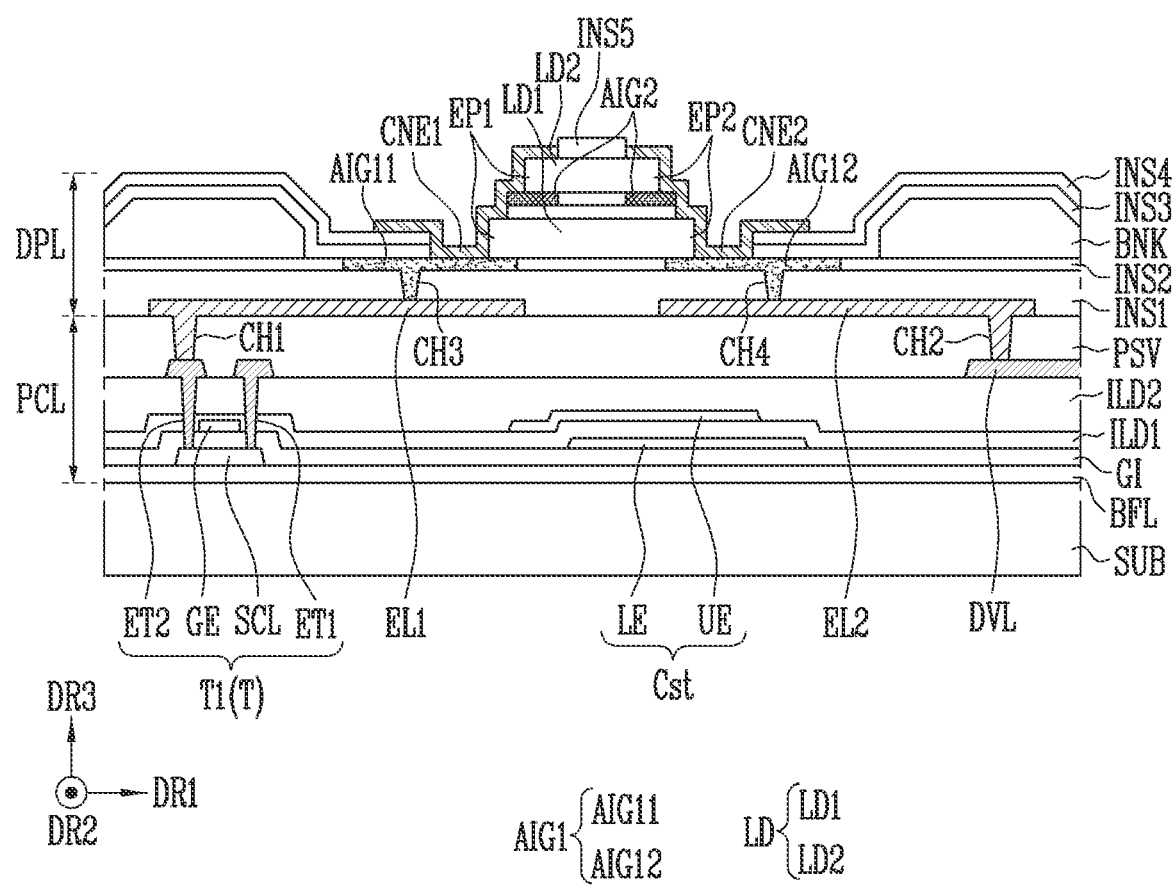
FIG. 15 illustrates a cross-sectional view of a display device according to an embodiment.

FIG. 15 illustrates a cross-sectional view of a display device according to an embodiment. The embodiment of FIG. 15 has a structure similar to that of FIG. 7, so contents overlapping those described in FIG. 7 are omitted.

Referring to FIG. 15, the display device according to some embodiments may include the substrate SUB, the pixel circuit layer PCL, and the display element layer DPL.

The pixel circuit layer PCL that includes the buffer layer BFL, at least one transistor T, at least one storage capacitor Cst, the driving voltage wire DVL, a plurality of insulation layers GI, ILD1, and ILD2, and the passivation layer PSV, is disposed on the substrate SUB.

The display element layer DPL is disposed on the pixel circuit layer PCL.

The display element layer DPL may include the first electrode EL1, the second electrode EL2, the bank BNK, the first alignment electrode AIG1, the second alignment electrode AIG2, the light emitting element LD, the first contact electrode CNE1, the second contact electrode CNE2, and a plurality of insulation layers INS1, INS2, INS3, INS4, and INS5.

The first electrode EL1 and the second electrode EL2 are disposed on the passivation layer PSV. Each of the first electrode EL1 and the second electrode EL2 may be made of a material having a reflectance (e.g., a set or predetermined reflectance) in order to direct light emitted from the light emitting element LD in an image display direction of the display device (for example, the front direction).

The first insulation layer INS1 is disposed on the first electrode EL1 and the second electrode EL2 to cover the first electrode EL1, the second electrode EL2, and the passivation layer PSV. The first insulation layer INS1 may include an inorganic insulation film made of an inorganic material or an organic insulation film made of an organic material.

The first alignment electrode AIG1 is disposed on the first insulation layer INS1.

The first alignment electrode AIG1 is for aligning the first light emitting element LD1, and includes a first sub-alignment electrode AIG11 and a second sub-alignment electrode AIG12. A voltage for aligning the first light emitting element LD1 may be applied to the first alignment electrode AIG1. The first end portion EP1 and the second end portion EP2 of the first light emitting element LD1 may be disposed to be directed to the first sub-alignment electrode AIG11 and the second sub-alignment electrode AIG12, respectively.

The first sub-alignment electrode AIG11 is physically and/or electrically connected to the first electrode EL1 through the third contact hole CH3 of the first insulation layer INS1. In some embodiments, the second sub-alignment electrode AIG12 is physically and/or electrically connected to the second electrode EL2 through the fourth contact hole CH4. Accordingly, the voltage of the first driving power supply source (VDD in FIG. 2) may be applied to the first sub-alignment electrode AIG11, and the voltage of the second driving power supply source (VSS in FIG. 2) may be applied to the second sub-alignment electrode AIG12.

The second insulation layer INS2 is disposed on the first insulation layer INS1 to cover the first insulation layer INS1. The second insulation layer INS2 may be partially opened so that the front surface of the first alignment electrode AIG1 may be exposed. The second insulation layer INS2 may include an inorganic insulation film made of an inorganic material or an organic insulation film made of an organic material.

The bank BNK is disposed on the second insulation layer INS2. In some embodiments, the first light emitting element LD1 is disposed on the second insulation layer INS2. The first light emitting element LD1 may be disposed between the banks BNK in the first direction DR1.

The first light emitting element LD1 is disposed to at least partially overlap the first alignment electrode AIG1. That is, a portion of the first end portion EP1 of the first light emitting element LD1 may directly contact an edge of the first sub-alignment electrode AIG11 to be physically and/or electrically connected thereto, and a portion of the second end portion EP2 of the first light emitting element LD1 may directly contact an edge of the second sub-alignment electrode AIG12 to be physically and/or electrically connected thereto.

The third insulation layer INS3 is disposed on the first light emitting element LD1, the first alignment electrode AIG1, and the bank BNK. The third insulation layer INS3 may be partially opened to expose portions of surfaces of the first light emitting element LD1 and the first alignment electrode AIG1. Accordingly, the first end portion EP1 and the second end portion EP2 of the first light emitting element LD1 may be exposed to be physically and/or electrically connected to the first contact electrode CNE1 and the second contact electrode CNE2, respectively. In some embodiments, the upper surfaces of the first sub-alignment electrode AIG11 and the second sub-alignment electrode AIG2 may be exposed to be physically and/or electrically connected to the first contact electrode CNE1 and the second contact electrode CNE2, respectively.

The second alignment electrode AIG2 is disposed on the third insulation layer INS3.

The second alignment electrode AIG2 is for aligning the second light emitting element LD2, and is disposed between the first end portion EP1 and the second end portion EP2 of the first light emitting element LD1 in the first direction DR1. The second alignment electrode AIG2 may be configured of two second alignment electrodes AIG2 that are spaced from each other in the first direction DR1.

A voltage for aligning the second light emitting element LD2 may be applied to the two second alignment electrodes AIG2. The first end portion EP1 and the second end portion EP2 of the second light emitting element LD2 may be disposed to at least partially overlap the two second alignment electrodes AIG2.

The fourth insulation layer INS4 is disposed on the third insulation layer INS3. The fourth insulation layer INS4 may be partially opened so that the first alignment electrode AIG1, the two second alignment electrodes AIG2, and the first end portion EP1 and the second end portion EP2 of the first light emitting element LD1 may be exposed. The fourth insulation layer INS4 may be disposed between the two second alignment electrodes AIG2.

In some embodiments, the first end portion EP1 of the first light emitting element LD1 may be physically and/or electrically connected to the first sub-alignment electrode AIG11, and the second end portion EP2 of the first light emitting element LD1 may be physically and/or electrically connected to the second sub-alignment electrodes AIG12.

The second light emitting element LD2 is disposed on the two second alignment electrodes AIG2 and a portion of the fourth insulation layer INS4. The first end portion EP1 and the second end portion EP2 of the second light emitting element LD2 may be disposed within the edges of the two second alignment electrodes AIG2.

The fifth insulation layer INS5 is disposed on the second light emitting element LD2. The fifth insulation layer INS5 is partially disposed on the second light emitting element LD2 so that the first end portion EP1 and the second end portion EP2 of the second light emitting elements LD2 are exposed.

The fifth insulation layer INS5 may be formed as a single film or multi-film, and may include an inorganic insulation film including at least one inorganic material or an organic insulation film including at least one organic material. The fifth insulation layer INS5 may include an inorganic insulation film that is suitable for protecting the active layer (12 in FIG. 3) of each of the light emitting elements LD from external oxygen and moisture. However, the present disclosure is not limited thereto. Depending on design conditions of the display device to which the light emitting elements LD are applied, the fifth insulation layer INS5 may be formed as an organic insulation film including an organic material. After the alignment of the second light emitting elements LD2 is completed, by forming the fifth insulation layer INS5 on the second light emitting element LD2, it is possible to prevent the second light emitting element LD2 from deviating from the aligned position thereof.

The first contact electrode CNE1 and the second contact electrode CNE2 are disposed with the fifth insulation layer INS5 therebetween.

The first contact electrode CNE1 is disposed on the first alignment electrode AIG1, the first light emitting element LD1, one of the two second alignment electrodes AIG2, and the second light emitting element LD2. For example, the first contact electrode CNE1 contacts a portion of an upper surface of the first sub-alignment electrode AIG11, the first end portion EP1 of the first light emitting element LD1, a portion of an upper surface of one second alignment electrode AIG2, the first end portion EP1 of the second light emitting element LD2, a portion of the third insulation layer INS3, a portion of the fourth insulation layer INS4, and a side surface of the fifth insulation layer INS5.

The first contact electrode CNE1 may transmit the voltage of the first driving power source (VDD in FIG. 2) from the first sub-alignment electrode AIG1 to the first end portion EP1 of the first light emitting element LD1 and the first end portion EP1 of the second light emitting element LD2.

The second contact electrode CNE2 is disposed on the first alignment electrode AIG1, the other of the two second alignment electrodes AIG2, the first light emitting element LD1, and the second light emitting element LD2. For example, the second contact electrode CNE2 contacts a portion of an upper surface of the second sub-alignment electrode AIG12, the second end portion EP2 of the first light emitting element LD1, a portion of an upper surface of the other second alignment electrode AIG2, the second end portion EP2 of the second light emitting element LD2, a portion of the third insulation layer INS3, a portion of the fourth insulation layer INS4, and a side surface of the fifth insulation layer INS5.

The second contact electrode CNE2 may transmit the voltage of the second driving power source (VSS in FIG. 2) from the second sub-alignment electrode AIG2 to the second end portion EP2 of the first light emitting element LD1 and the second end portion EP2 of the second light emitting element LD2.

In some embodiments, the display element layer DPL may be configured to selectively further include an optical layer in addition to the insulation layer. As an example, the display element layer DPL may further include a color conversion layer including color conversion particles that convert light emitted from the light emitting elements LD into light of a specific color.

According to another embodiment, at least one overcoat layer (for example, a layer flattening the upper surface of the display element layer DPL) may be further disposed on the insulation layer.

Hereinafter, a manufacturing method of the display device of FIG. 15 will be specifically described with reference to FIG. 16-FIG. 21.

FIG. 16-FIG. 21 illustrate sequential cross-sectional views of a manufacturing method of a display device according to an embodiment. The embodiment of FIG. 16-FIG. 21 discloses contents similar to those of FIG. 8-FIG. 13, so contents overlapping those described in FIG. 8-FIG. 13 are omitted.

Figure 16:
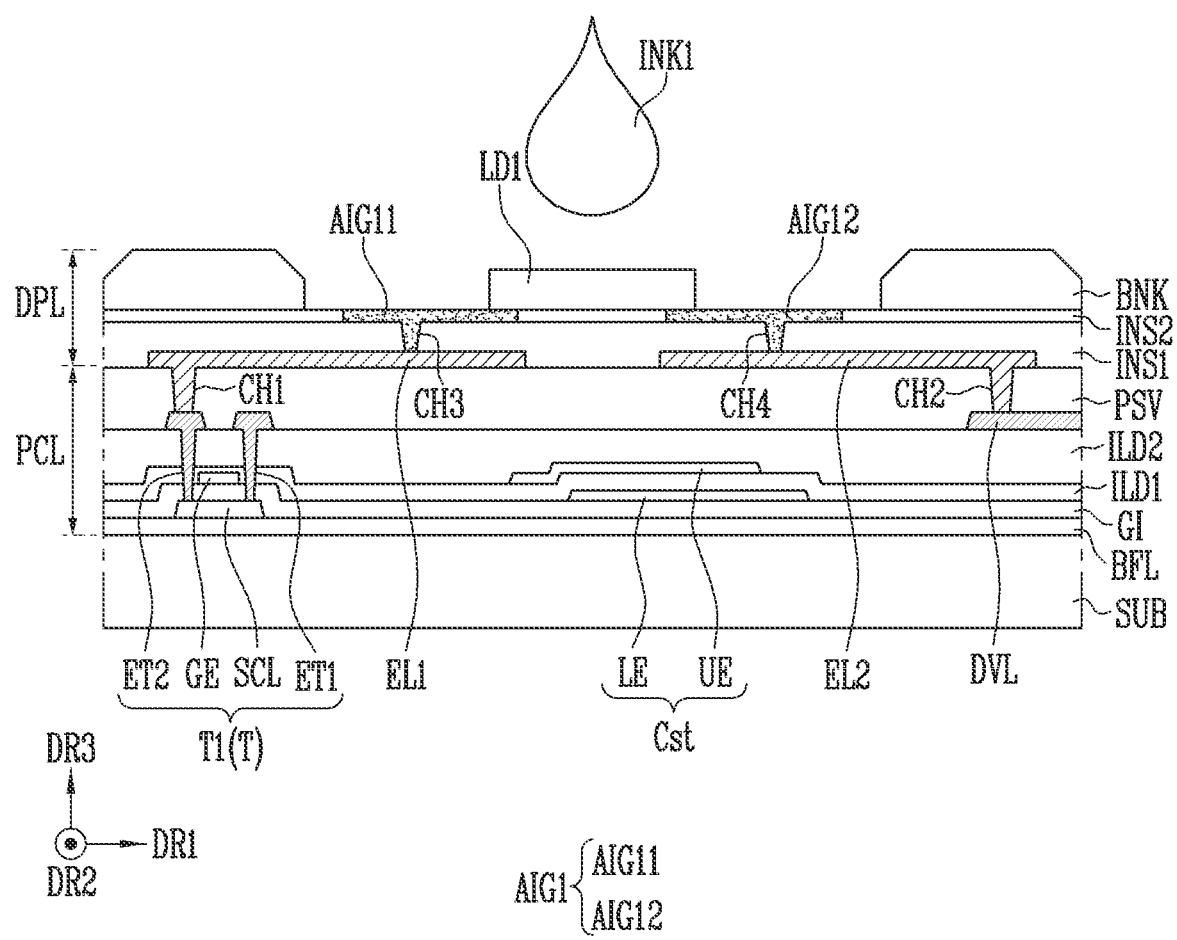
FIG. 16-FIG. 21 illustrate sequential cross-sectional views of a manufacturing method of a display device according to an embodiment.

First, referring to FIG. 16, the substrate SUB in which the pixel circuit layer PCL and the display element layer DPL are partially formed on an upper surface thereof is provided. The pixel circuit layer PCL is formed on the substrate SUB, and the first insulation layer INS1, the second insulation layer INS2, the first alignment electrode AIG1, and the bank BNK are formed on the pixel circuit layer PCL.

In order to form the first light emitting element LD1 on the display element layer DPL, a first ink INK1 (e.g., a set or predetermined first ink INK1) is sprayed between the first sub-alignment electrode AIG11 and the second sub-alignment electrode AIG12.

After the first ink INK1 is sprayed, when an alignment voltage (e.g., a set or predetermined alignment voltage) (or alignment signal) is applied to the first sub-alignment electrode AIG11 and the second sub-alignment electrode AIG12, as an electric field is formed between the first sub-alignment electrode AIG11 and the second sub-alignment electrode AIG12, the plurality of first light emitting elements LD1 are aligned between the first sub-alignment electrode AIG11 and the second sub-alignment electrode AIG12. The plurality of first light emitting elements LD1 may be disposed to be spaced from each other in the second direction DR2 as shown in FIG. 4 and FIG. 6 described above, when viewed in a plan view.

After the first light emitting elements LD1 are aligned, it is possible to stably arrange the first light emitting elements LD1 between the first sub-alignment electrode AIG11 and the second sub-alignment electrode AIG12 by volatilizing the first ink INK1 or by removing it with another method.

In some embodiments, the number of the first light emitting elements LD1 included in the first ink INK1 may be smaller than the number of the first light emitting elements LD1 included in the first ink INK1 according to the comparative example. In this case, when the first ink INK1 is sprayed and the first light emitting elements LD1 are aligned between the first sub-alignment electrode AIG11 and the second sub-alignment electrode AIG12, an interval between each first light emitting element LD1 and the first light emitting element LD1 adjacent thereto may be sufficiently secured. Therefore, in some embodiments, the aggregation of light emitting elements LD may be improved compared to the comparative example.

Figure 17:
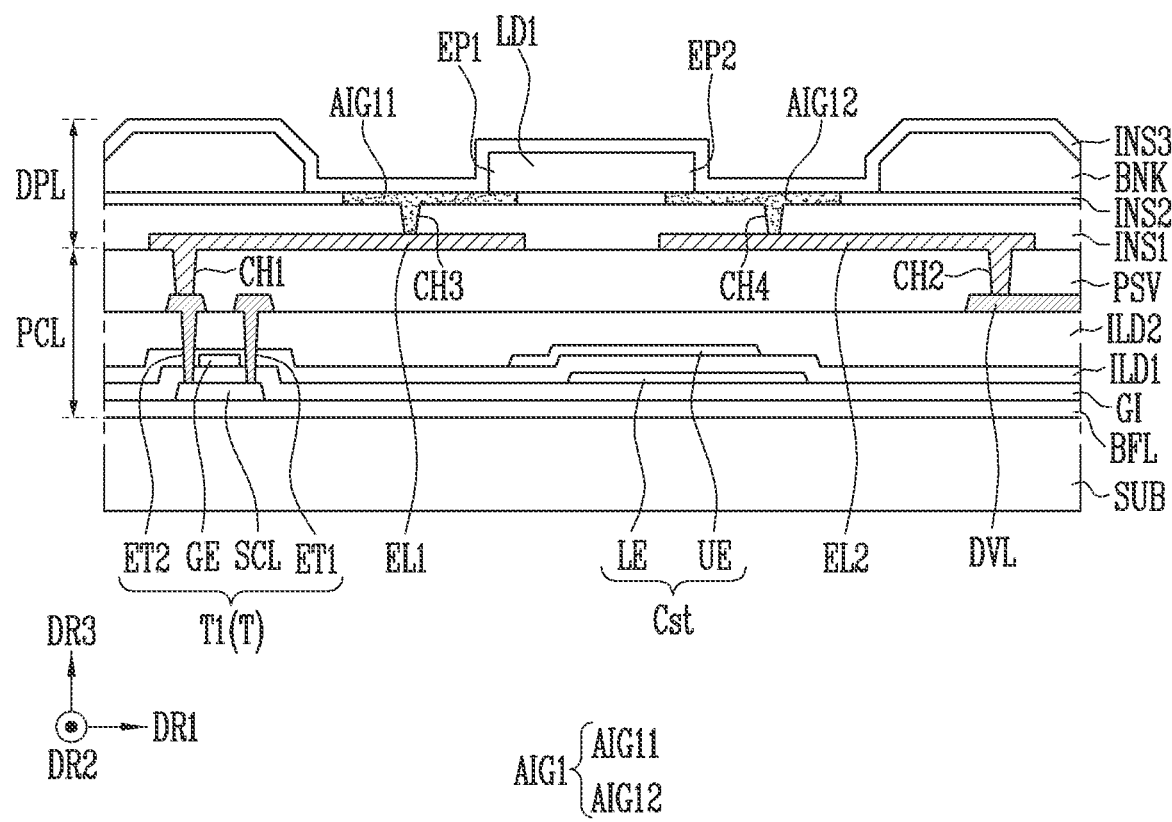

Referring to FIG. 17, the third insulation layer INS3 is formed to cover the surfaces of the first light emitting element LD1, the first sub-alignment electrode AIG11, the second sub-alignment electrode AIG12, the bank BNK, and the second insulation layer INS2 that are aligned between the first sub-alignment electrode AIG11 and the second sub-alignment electrode AIG12.

Figure 18:
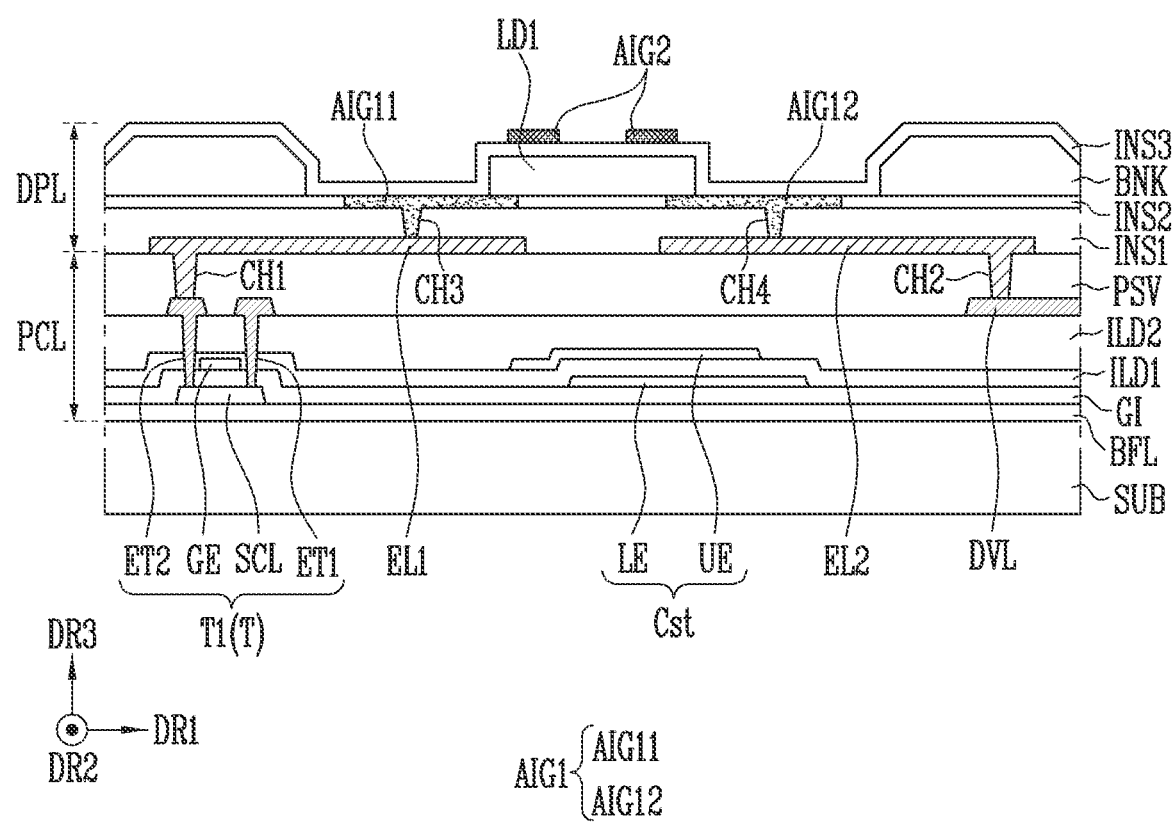

Referring to FIG. 18, the second alignment electrode AIG2 is formed on the third insulation layer INS3. The second alignment electrode AIG2 may be formed above the third insulation layer INS3 overlapping the first light emitting element LD1. Thereafter, the fourth insulation layer INS4 is formed to cover the second alignment electrode AIG2 and the third insulation layer INS3, and a portion of the fourth insulation layer INS4 is removed so that an upper surface of the second alignment electrode AIG2 is exposed.

Figure 19:
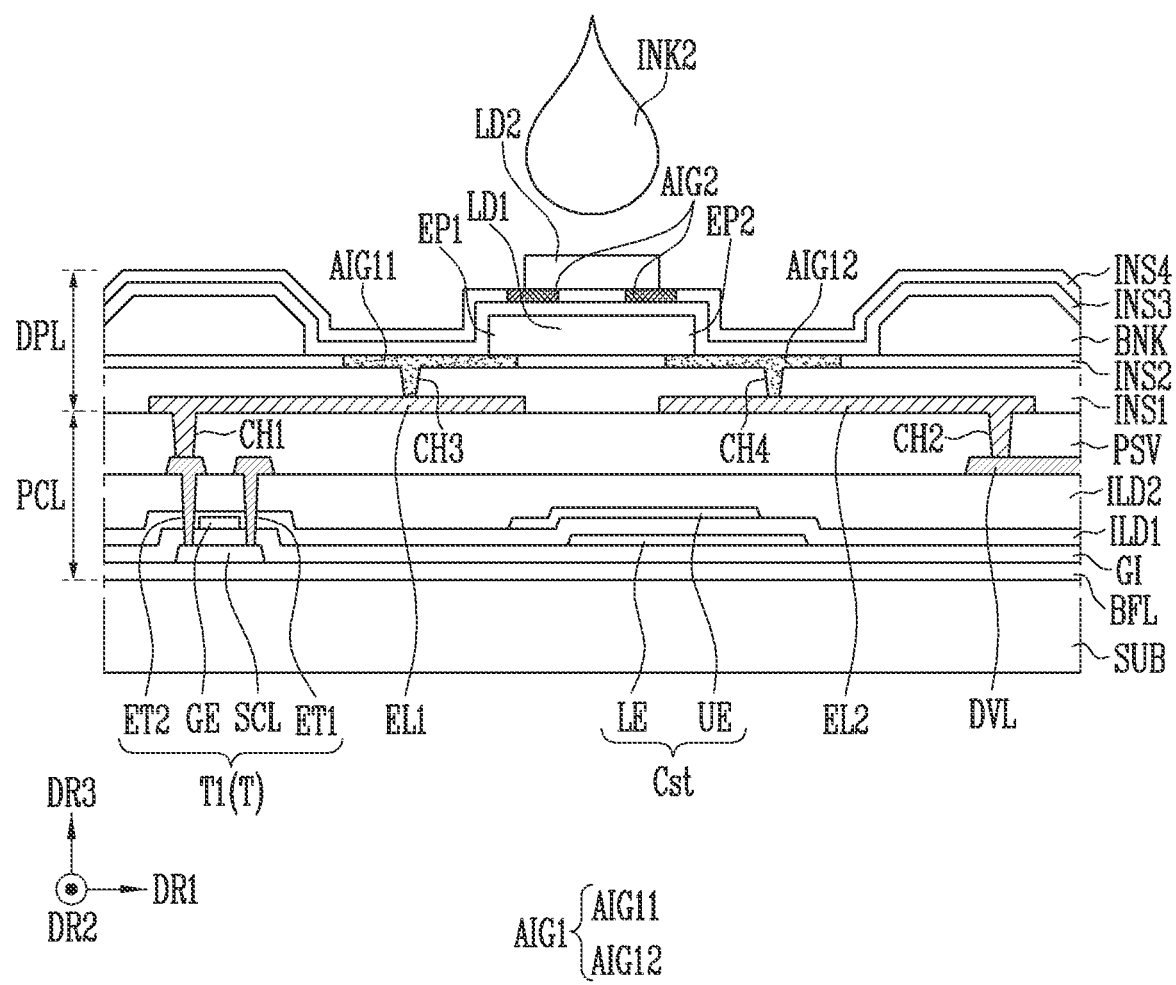

Referring to FIG. 19, the second ink INK2 is sprayed on the fourth insulation layer INS4 and the second alignment electrode AIG2. The second ink INK2 may be sprayed to overlap a corresponding area between two second alignment electrodes AIG2.

After the second ink INK2 is sprayed, when an alignment voltage (e.g., a set or predetermined alignment voltage) (or alignment signal) is applied to the two second alignment electrodes AIG2, as an electric field is formed between the two second alignment electrodes AIG2, the second light emitting elements LD2 are aligned in one area of the fourth insulation layer INS4 corresponding to the two second alignment electrodes AIG2. After the second light emitting elements LD2 are aligned, it is possible to stably arrange the second light emitting elements LD2 between the two second alignment electrodes AIG2 by volatilizing the second ink INK2 or by removing it with another method.

The second light emitting element LD2 may be formed on a different layer from the first light emitting element LD1, with the third insulation layer INS3 and the fourth insulation layer INS4 interposed therebetween. In FIG. 19, it is shown that the second light emitting element LD2 is formed to overlap the first light emitting element LD1 in a cross-sectional view, but referring to FIG. 4, FIG. 5A, and FIG. 5B described above, one second light emitting element LD2 may be formed between two first light emitting elements LD1. That is, one second light emitting element LD2 may be disposed to correspond to concave portions of the third insulation layer INS3 and the fourth insulation layer INS4 covering the two first light emitting elements LD1.

In some embodiments, because the first ink INK1 including the first light emitting elements LD1 and the second ink INK2 including the second light emitting elements LD2 are sprayed in separate steps, after the first ink INK1 and the second ink INK2 are respectively sprayed, when the first light emitting elements LD1 and the second light emitting elements LD2 are aligned, the aggregation of the light emitting elements LD may be improved compared to the comparative example.

Figure 20:
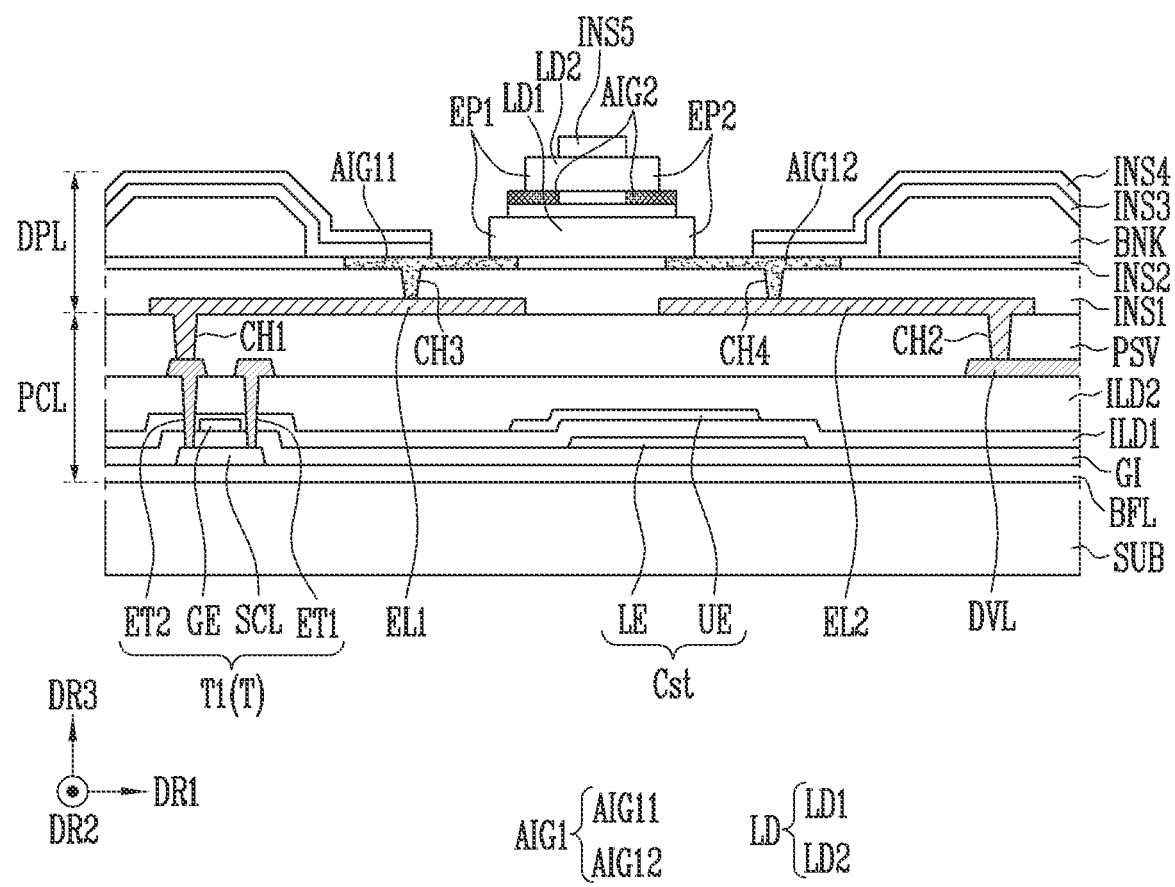

Referring to FIG. 20, the fifth insulation layer INS5 is formed on the second light emitting element LD2, and portions of the third insulation layer INS3 and the fourth insulation layer INS4 are partially opened.

The surfaces of the first alignment electrode AIG1, the second alignment electrode AIG2, the first light emitting element LD1, and the second light emitting element LD2 are partially exposed by openings of the third insulation layer INS3 and the fourth insulation layer INS4.

Figure 21:
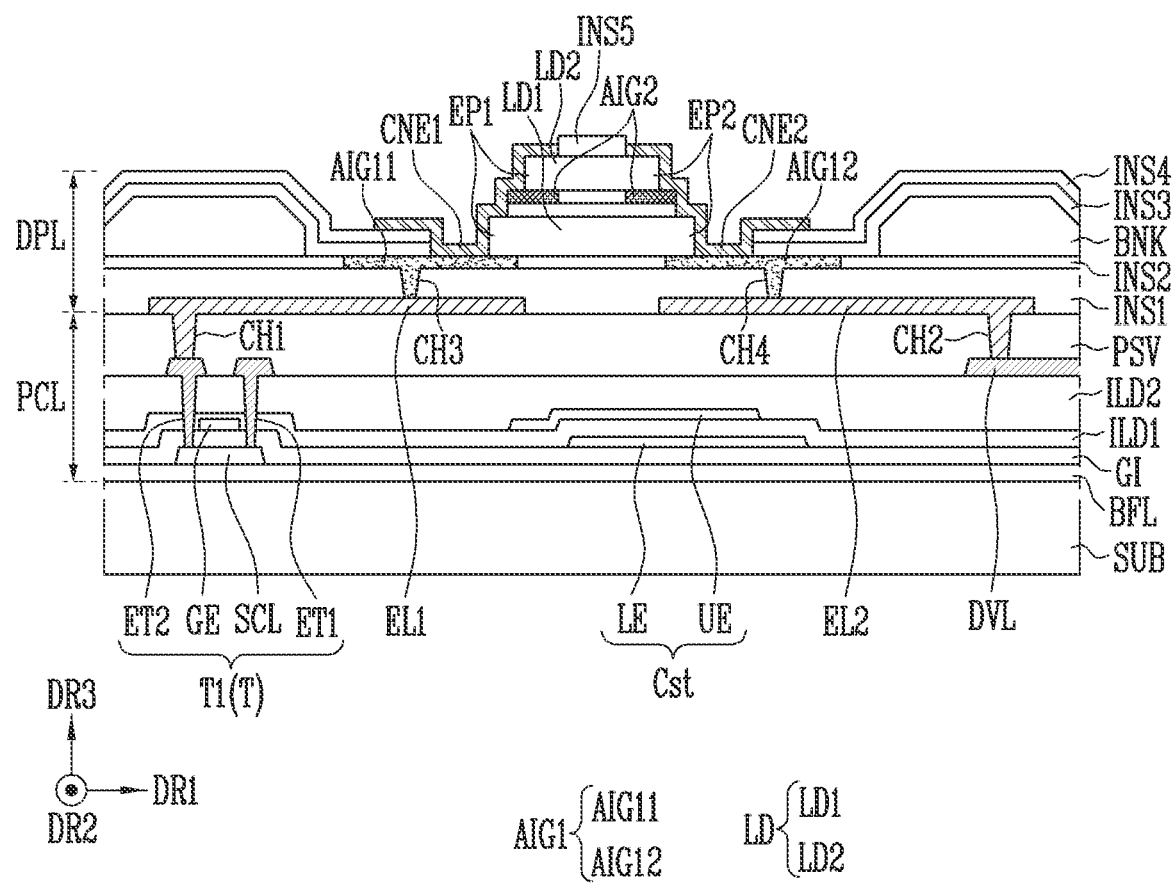

Referring to FIG. 21, in the area from which the third insulation layer INS3 and the fourth insulation layer INS4 are removed, the first contact electrode CNE1 and the second contact electrode CNE2 are formed.

The first contact electrode CNE1 may be formed to contact a portion of an upper surface of the first sub-alignment electrode AIG11, the first end portion EP1 of the first light emitting element LD1, a portion of an upper surface of the second alignment electrode AIG2, the first end portion EP1 of the second light emitting element LD2, a portion of the third insulation layer INS3, a portion of the fourth insulation layer INS4, and a side surface of the fifth insulation layer INS5.

The second contact electrode CNE2 may be formed to contact a portion of an upper surface of the second sub-alignment electrode AIG12, the second end portion EP2 of the first light emitting element LD1, a portion of an upper surface of the second alignment electrode AIG2, the second end portion EP2 of the second light emitting element LD2, a portion of the third insulation layer INS3, a portion of the fourth insulation layer INS4, and a side surface of the fifth insulation layer INS5.

As described above, according to the display device of the embodiments of the present disclosure, because the first light emitting elements LD1 and the second light emitting elements LD2 are arranged through a primary inkjet printing process and a secondary inkjet printing process, respectively, it is possible to improve the aggregation of the light emitting elements, compared with the performing of only the inkjet printing process once. Therefore, it is possible to improve emission efficiency of the display device.

Hereinafter, another structure of a display device according to an embodiment will be described with reference to FIG. 22 and FIG. 23.

Figure 22:
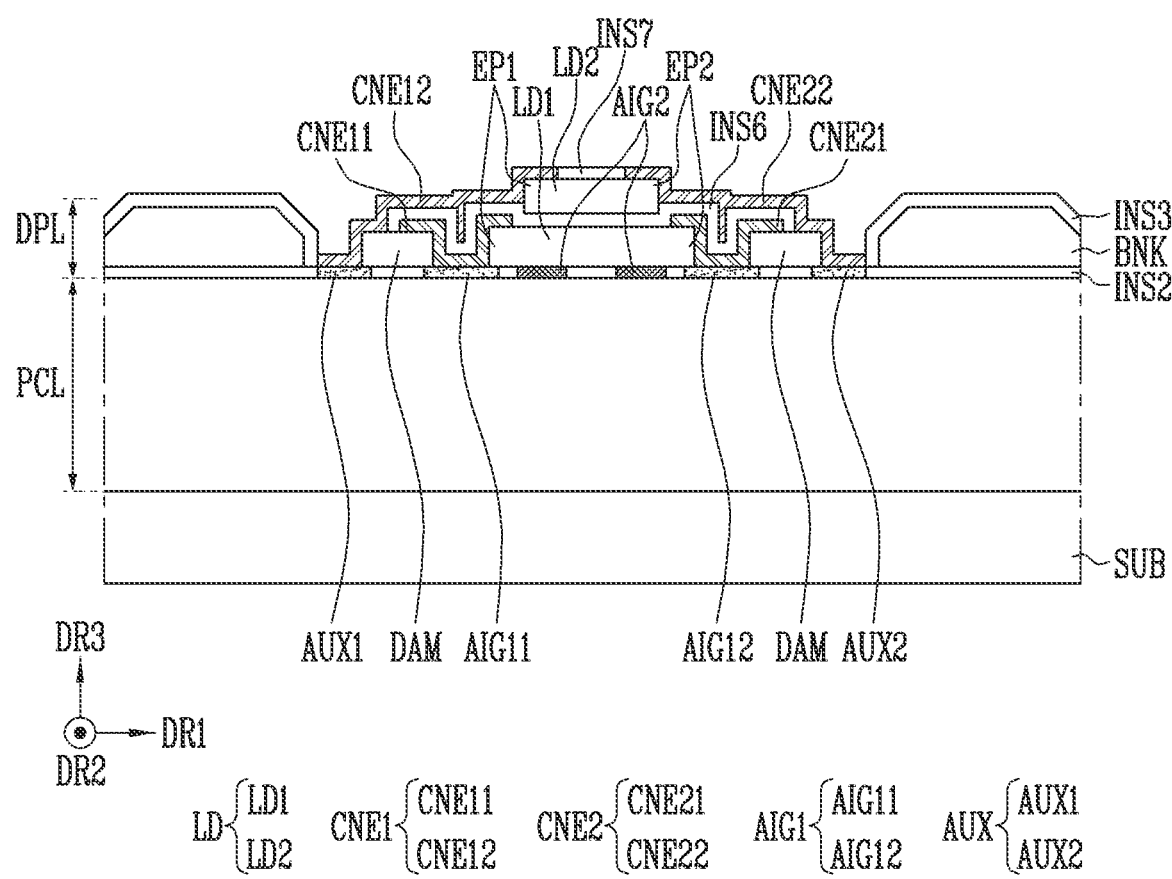
FIG. 22 illustrates a schematic cross-sectional view of a display device according to an embodiment.
Figure 23:
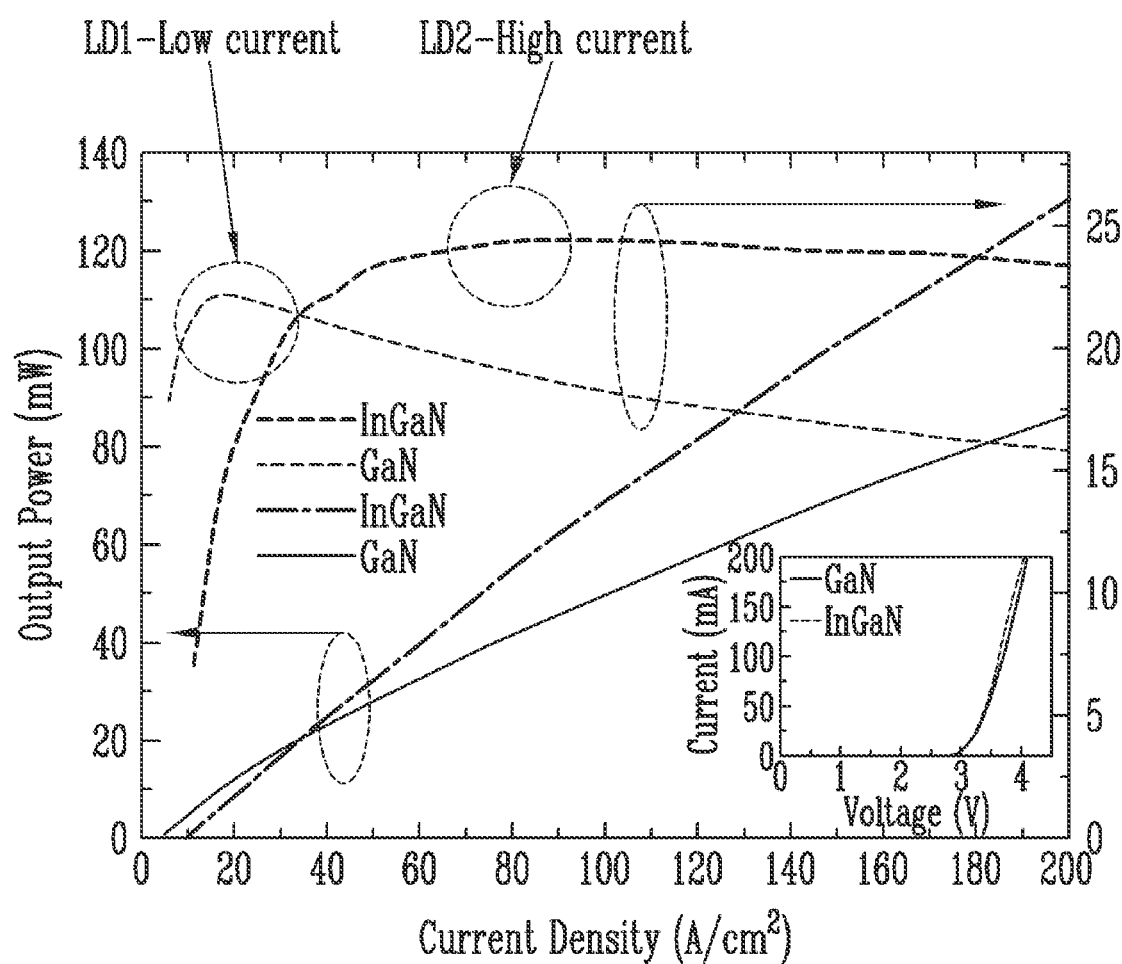
FIG. 23 illustrates a graph for explaining a driving effect of a display device according to an embodiment.

FIG. 22 illustrates a schematic cross-sectional view of a display device according to an embodiment, and FIG. 23 illustrates a graph for explaining a driving effect of a display device according to an embodiment. The embodiment of FIG. 22 has a structure similar to that of FIG. 7, so contents overlapping those described in FIG. 7 are omitted.

Referring to FIG. 7 and FIG. 22, the display device according to some embodiments may include the substrate SUB, the pixel circuit layer PCL, and the display element layer DPL.

The pixel circuit layer PCL is disposed on the substrate SUB, and the display element layer DPL is disposed on the pixel circuit layer PCL.

The display element layer DPL may include the first electrode EL1, the second electrode EL2, the bank BNK, the first alignment electrode AIG1, the second alignment electrode AIG2, the light emitting element LD, the first contact electrode CNE1, the second contact electrode CNE2, and a plurality of insulation layers INS2, INS3, INS6, and INS7.

The first electrode EL1, the second electrode EL2, and the first insulation layer INS1 are omitted in the display element layer DPL shown in FIG. 22, but the first electrode EL1 may be physically and/or electrically connected to a first sub-alignment electrode AIG11 and/or a first auxiliary electrode AUX1 to be described later, and the second electrode EL2 may be physically and/or electrically connected to a second sub-alignment electrode AIG12 and/or a second auxiliary electrode AUX2 to be described later.

The first alignment electrode AIG1, the first auxiliary electrode AUX1, the second auxiliary electrode AUX2, and the second alignment electrode AIG2 are disposed on the pixel circuit layer PCL. The first auxiliary electrode AUX1 and the second auxiliary electrode AUX2 may be referred to as auxiliary electrode AUX.

The first alignment electrode AIG1 is for aligning the first light emitting element LD1, and includes the first sub-alignment electrode AIG11 and the second sub-alignment electrode AIG12.

A voltage for aligning the first light emitting element LD1 may be applied to the first sub-alignment electrode AIG11 and the second sub-alignment electrode AIG12. In some embodiments, the first sub-alignment electrode AIG11 may be physically and/or electrically connected to the first electrode (EL1 in FIG. 2) to receive the voltage of the first driving power source (VDD in FIG. 2). The second sub-alignment electrode AIG12 may be physically and/or electrically connected to the second electrode (EL2 in FIG. 2) to receive the voltage of the second driving power source (VSS in FIG. 2).

In some embodiments, the voltage of the first driving power source VDD and the voltage of the second driving power source VSS that are applied to the first sub-alignment electrode AIG11 and the second sub-alignment electrode AIG12 may be for driving the first light emitting element LD1. In some embodiments, the voltage of the first driving power source VDD and the voltage of the second driving power source VSS that are applied to the first sub-alignment electrode AIG11 and the second sub-alignment electrode AIG12 may be voltages for driving a low current region.

Referring to FIG. 23, a driving current and output power according to types of the light emitting element are shown. Because the material included in the first light emitting element LD1 is shown as a thin dotted line, it can be confirmed that it may output a power (e.g., a set or predetermined power) at a low current.

The first auxiliary electrode AUX1 and the second auxiliary electrode AUX2 are disposed at the same layer as the first alignment electrode AIG1 and the second alignment electrode AIG2. For example, the first auxiliary electrode AUX1 and the second auxiliary electrode AUX2 are spaced from each other with the first alignment electrode AIG1 interposed therebetween in the first direction DR1.

A voltage for driving the second light emitting element LD2 may be applied to the first auxiliary electrode AUX1 and the second auxiliary electrode AUX2. The first auxiliary electrode AUX1 may be physically and/or electrically connected to the first electrode (EU in FIG. 2) to receive the voltage of the first driving power source (VDD in FIG. 2). The second auxiliary electrode AUX2 may be physically and/or electrically connected to the second electrode (EL2 in FIG. 2) to receive the voltage of the second driving power source (VSS in FIG. 2). Here, the first electrode EL1 and the second electrode EL2 connected to the first auxiliary electrode AUX1 and the second auxiliary electrode AUX2 may be the same electrodes as the first electrode EL1 and the second electrode EL2 to which the first alignment electrode AIG1 is connected. However, the present disclosure is not limited thereto, and in some embodiments, the first electrode EL1 and the second electrode EL2 to which the first auxiliary electrode AUX1 and the second auxiliary electrode AUX2 are connected may be separately provided to be different from the first electrode EL1 and the second electrode EL2 to which the first alignment electrode AIG1 is connected.

In some embodiments, the voltage of the first driving power source VDD and the voltage of the second driving power source VSS that are applied to the first auxiliary electrode AUX1 and the second auxiliary electrode AUX2 may be for driving the second light emitting element LD2. In some embodiments, the voltage of the first driving power source VDD and the voltage of the second driving power source VSS that are applied to the first auxiliary electrode AUX1 and the second auxiliary electrode AUX2 may be voltages for driving a high current region.

Referring to FIG. 23, driving current and output power according to types of the light emitting element are shown. Because the material included in the second light emitting element LD2 is shown as a thick dotted line, it can be confirmed that it may output a power (e.g., a set or predetermined power) at a high current.

The second alignment electrode AIG2 is for aligning the second light emitting element LD2, and is disposed between the first sub-alignment electrode AIG11 and the second sub-alignment electrode AIG12 in the first direction DR1. The second alignment electrode AIG2 may be configured of two second alignment electrodes AIG2, the two second alignment electrodes AIG2 are spaced from each other in first direction DR1, and each of the second alignment electrodes AIG2 is spaced from the first sub-alignment electrode AIG11 and the second sub-alignment electrode AIG12.

In some embodiments, the second alignment electrode AIG2 may be omitted. In this case, the second light emitting element LD2 may be aligned by applying an alignment voltage (or alignment signal) to the first alignment electrode AIG1. In some embodiments, the second alignment electrode AIG2 may be disposed to directly contact a lower portion of the second light emitting element LD2, as described with reference to FIG. 15.

The second insulation layer INS2 may be disposed above the first alignment electrode AIG1, the first auxiliary electrode AUX1, the second auxiliary electrode AUX2, and the second alignment electrode AIG2. The second insulation layer INS2 may be partially opened so that the front surfaces of the first alignment electrode AIG1, the first auxiliary electrode AUX1, the second auxiliary electrode AUX2, and the second alignment electrode AIG2 may be exposed.

The bank BNK is disposed on the second insulation layer INS2. In some embodiments, the first light emitting element LD1 is disposed on the second insulation layer INS2.

The third insulation layer INS3 is disposed on the bank BNK, the first auxiliary electrode AUX1, and the second auxiliary electrode AUX2. The third insulation layer INS3 may be opened so that the upper surfaces of the first auxiliary electrode AUX1 and the second auxiliary electrode AUX2 may be partially exposed.

An insulation dam DAM is disposed on the auxiliary electrode AUX and the first alignment electrode AIG1. For example, the insulation dam DAM may be disposed to overlap at least a portion of the first auxiliary electrode AUX1 and first sub-alignment electrode AIG11, and the insulation dam DAM may be disposed to overlap at least a portion of the second auxiliary electrode AUX2 and second sub-alignment electrode AIG12.

The first contact electrode CNE1 includes a first lower contact electrode CNE11 and a first upper contact electrode CNE12 disposed in different layers with a sixth insulation layer INS6 interposed therebetween. The first lower contact electrode CNE11 and the first upper contact electrode CNE21 may be electrically insulated by the sixth insulation layer INS6. The second contact electrode CNE2 includes a second lower contact electrode CNE21 and a second upper contact electrode CNE22 disposed in different layers with the sixth insulation layer INS6 interposed therebetween. The second lower contact electrode CNE21 and the second upper contact electrode CNE22 may be electrically insulated by the sixth insulation layer INS6.

The first lower contact electrode CNE11 is disposed on the insulation dam DAM, the first sub-alignment electrode AIG11, and the first light emitting element LD1. The first lower contact electrode CNE11 overlaps portions of the insulation dam DAM, the first sub-alignment electrode AIG11, and the first light emitting element LD1. In some embodiments, the first lower contact electrode CNE11 contacts a portion of an upper surface of the first sub-alignment electrode AIG11 and the first end portion EP1 of the first light emitting element LD1, so that it is possible to physically and/or electrically connect the first sub-alignment electrode AIG11 and the first end portion EP1 of the first light emitting element LD1. Accordingly, the voltage of the first driving power source (VDD in FIG. 2) that may be applied through the first sub-alignment electrode AIG11 may be transmitted to the first end portion EP1 of the first light emitting element LD1.

The second lower contact electrode CNE21 is disposed on the insulation dam DAM, the second sub-alignment electrode AIG12, and the first light emitting element LD1. The second lower contact electrode CNE21 overlaps portions of the insulation dam DAM, the second sub-alignment electrode AIG12, and the first light emitting element LD1. In some embodiments, the second lower contact electrode CNE21 contacts a portion of an upper surface of the second sub-alignment electrode AIG12 and the second end portion EP2 of the first light emitting element LD1, so that it is possible to physically and/or electrically connect the second sub-alignment electrode AIG12 and the second end portion EP2 of the first light emitting element LD1. Accordingly, the voltage of the second driving power source (VSS in FIG. 2) that may be applied through the second sub-alignment electrode AIG12 may be transmitted to the second end portion EP2 of the first light emitting element LD1.

The sixth insulation layer INS6 is disposed on the first lower contact electrode CNE11, the second lower contact electrode CNE21, and the first light emitting element LD1. The sixth insulation layer INS6 may be disposed to cover the front surfaces of the first lower contact electrode CNE11, the second lower contact electrode CNE21, and the first light emitting element LD1.

The sixth insulation layer INS6 may be formed as a single film or multi-film, and may include an inorganic insulation film including at least one inorganic material or an organic insulation film including at least one organic material.

The second light emitting element LD2 is disposed on the sixth insulation layer INS6. The second light emitting element LD2 may be disposed so as to overlap the two second alignment electrodes AIG2, and the first end portion EP1 and the second end portion EP2 of the second light emitting element LD2 may deviate from the edges of the two second alignment electrodes AIG2.

A seventh insulation layer INS7 is disposed on the second light emitting element LD2. The seventh insulation layer INS7 is partially disposed on the second light emitting element LD2 so that the first end portion EP1 and the second end portion EP2 of the second light emitting elements LD2 are exposed. The seventh insulation layer INS7 may have the same configuration as the fifth insulation layer INS5 described with reference to FIG. 21.

The first upper contact electrode CNE12 and the second upper contact electrode CNE22 are disposed with the seventh insulation layer INS7 therebetween.

The first upper contact electrode CNE12 and the second upper contact electrode CNE22 are disposed above the sixth insulation layer INS6, the second light emitting element LD2, the first auxiliary electrode AUX1, and the second auxiliary electrode AUX2.

The first upper contact electrode CNE12 contacts a portion of an upper surface of the first auxiliary electrode AUX1, the first end portion EP1 of the second light emitting element LD2, a portion of the sixth insulation layer INS6, and a side surface of the seventh insulation layer INS7. The first upper contact electrode CNE12 may transmit the voltage of the first driving power source (VDD in FIG. 2) from the first auxiliary electrode AUX1 to the first end portion EP1 of the second light emitting element LD2.

The second upper contact electrode CNE22 contacts a portion of an upper surface of the second auxiliary electrode AUX2, the second end portion EP2 of the second light emitting element LD2, a portion of the sixth insulation layer INS6, and a side surface of the seventh insulation layer INS7. The second upper contact electrode CNE22 may transmit the voltage of the second driving power source (VSS in FIG. 2) from the second auxiliary electrode AUX2 to the second end portion EP2 of the second light emitting element LD2.

As described above, because the display device according to some embodiments may separately drive the first light emitting element LD1 and the second light emitting element LD2, light corresponding to a wide current range may be emitted. Therefore, a display device having high luminance and a long life-span may be implemented.

Hereinafter, another arrangement structure of a light emitting element of a display device according to an embodiment will be described with reference to FIG. 24, FIG. 25A, and FIG. 25B.

Figure 24:
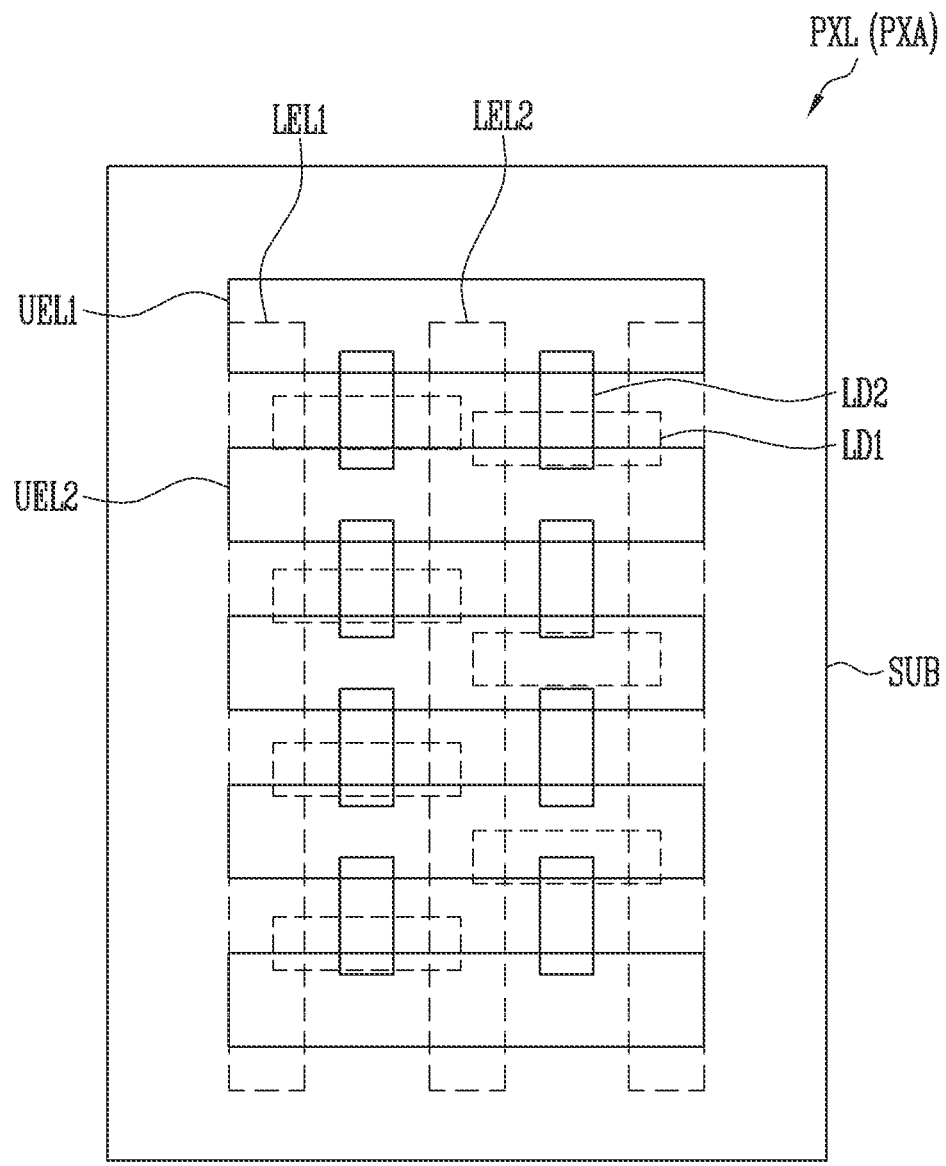
FIG. 24, FIG. 25A, and FIG. 25B illustrate schematic top plan views of arrangement of light emitting elements in one pixel of a display device according to an embodiment.
Figure 25A:
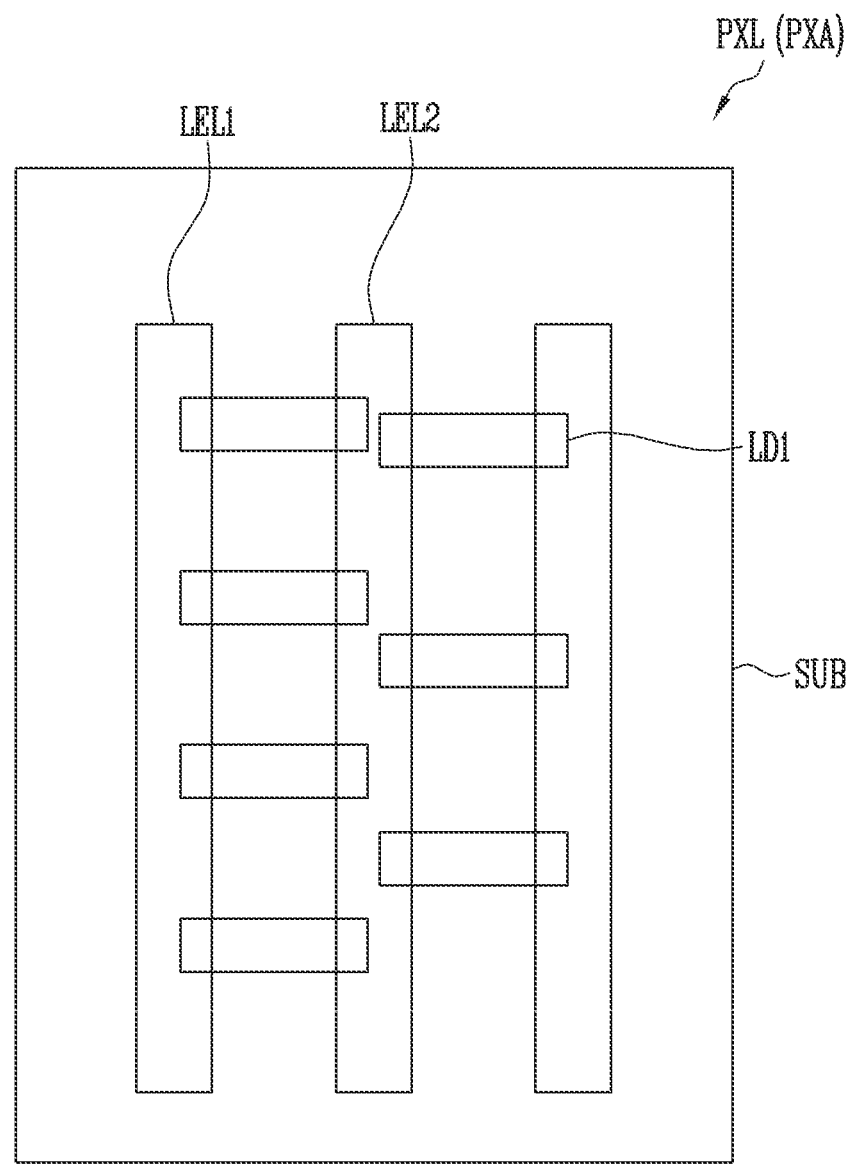
Figure 25B:
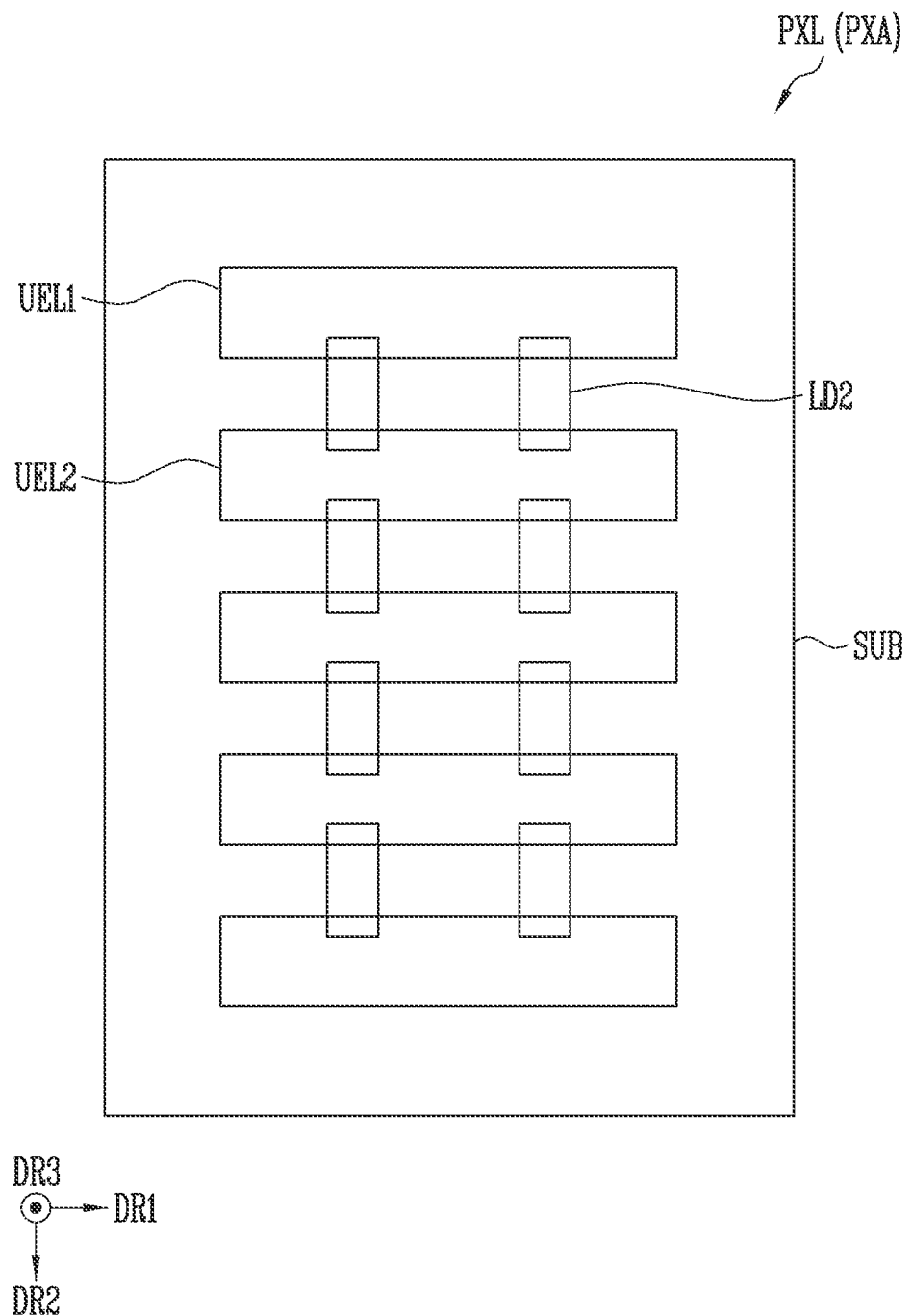

FIG. 24, FIG. 25A, and FIG. 25B illustrate schematic top plan views of arrangement of light emitting elements in one pixel of a display device according to an embodiment. In FIG. 24, FIG. 25A, and FIG. 25B, for convenience, only the first and second electrodes EL1 and EL2 disposed on the substrate SUB and the first and second light emitting elements LD1 and LD2 disposed therebetween are schematically shown.

In FIG. 24, the plurality of first light emitting elements LD1, the plurality of second light emitting elements LD2, the first electrodes EL1, and the second electrodes EL2 are disposed on the substrate SUB. In FIG. 25A, the plurality of first light emitting elements LD1, first lower electrodes LEL1, and second lower electrodes LEL2 are disposed on the substrate SUB, and in FIG. 25B, the plurality of second light emitting elements LD2, first upper electrodes UEL1, and second upper electrodes UEL2 are disposed on the substrate SUB.

First, referring to FIG. 24 and FIG. 25A, the first lower electrode LEL1 and the second lower electrode LEL2 are disposed to be spaced from each other in the first direction DR1 on the substrate SUB. FIG. 24 shows that the first lower electrode LEL1 and the second lower electrode LEL2 are separated from each other, but the first lower electrode LEL1 may be connected to the first lower electrode LEL1 provided to the pixel PXL adjacent thereto, and the second lower electrode LEL2 may be connected to the second lower electrode LEL2 provided to the pixel PXL adjacent thereto The plurality of first light emitting elements LD1 are disposed between the first lower electrode LEL1 and the second lower electrode LEL2. The first light emitting elements LD1 may be disposed between the first lower electrode LEL1 and the second lower electrode LEL2 in a length direction (e.g., the first direction DR1). In some embodiments, the first light emitting elements LD1 may be disposed to be spaced from each other in the second direction DR2.

Referring to FIG. 24 and FIG. 25B, the first upper electrode UEL1 and the second upper electrode UEL2 are disposed to be spaced from each other in the second direction DR2. A single-filmed or multi-filmed insulation layer may be disposed between the first upper electrode UEL1 and second upper electrode UEL2 and the first lower electrode LEL1 and second lower electrode LEL2. For example, the insulation layer (INS in FIG. 5A) may be disposed between the first lower electrode LEL1 and the first upper electrode UEL1, and the insulation layer (INS in FIG. 5A) may be disposed between the second lower electrode LEL2 and the second upper electrode UEL2.

The plurality of second light emitting elements LD2 are disposed between the first upper electrode UEL1 and the second upper electrode UEL2. The second light emitting elements LD2 may be disposed between the first upper electrode UEL1 and the second upper electrode UEL2 in a length direction (the first direction DR2). In some embodiments, the second light emitting elements LD2 may be disposed to be spaced from each other in the first direction DR1.

The first light emitting elements LD1 and the second light emitting elements LD2 may be disposed on different layers, and may alternately overlap each other.

As described above, in the display device according to the embodiments of the present disclosure, the second light emitting element LD2 is disposed between the first light emitting elements LD1 with the insulation layer interposed therebetween, thereby increasing a density of the light emitting elements LD within the pixel PXL. Therefore, luminance of the display device may increase, and a life-span thereof may increase.

While the present disclosure has been shown and described with reference to certain embodiments thereof, it will be understood by those skilled in the art that various changes in forms and details may be made therein without departing from the spirit and scope of the present disclosure as defined by the appended claims and their equivalents.

Therefore, the technical scope of the present disclosure may be determined by on the technical scope of the accompanying claims and their equivalents.

What is claimed is:

1. A display device comprising:
   a substrate;
   a first electrode and a second electrode spaced from each other on the substrate; and
   a first light emitting element and a second light emitting element arranged between the first electrode and the second electrode, wherein the first light emitting element and the second light emitting element are electrically insulated from each other, wherein the first light emitting element and the second light emitting element have different lengths, and wherein:

the first electrode comprises a first lower electrode and a first upper electrode, wherein an insulation layer is located between the first lower electrode and the first upper electrode;

the second electrode comprises a second lower electrode and a second upper electrode, wherein the insulation layer is located between the second lower electrode and the second upper electrode;

the first lower electrode and the second lower electrode are spaced from each other in a first direction and are located at a same layer; and the first upper electrode and the second upper electrode are spaced from each other in a second direction perpendicular to the first direction and are located at a same layer.

2. The display device of claim 1, wherein a length of the second light emitting element is shorter than that of the first light emitting element.

3. The display device of claim 1, wherein:
the first light emitting element and the second light emitting element have a cylindrical shape, and
the first light emitting element and the second light emitting element cross each other.

4. The display device of claim 1, wherein
the second light emitting element at least partially overlaps one surface of the first light emitting element.

5. The display device of claim 1, wherein:
the first light emitting element is located between the first lower electrode and the second lower electrode; and
the second light emitting element is located between the first upper electrode and the second upper electrode.

6. A display device comprising:
a substrate;
a first electrode and a second electrode on the substrate;
a first light emitting element located above the first electrode and the second electrode;
a second light emitting element located above the first light emitting element and having a different length from the first light emitting element;
an insulation layer between the first light emitting element and the second light emitting element;
a first contact electrode connecting a first end portion of the first light emitting element and a first end portion of the second light emitting element to the first electrode; and
a second contact electrode connecting a second end portion of the first light emitting element and a second end portion of the second light emitting element to the second electrode.

7. The display device of claim 6, wherein
a length of the second light emitting element is shorter than that of the first light emitting element.

8. The display device of claim 7, further comprising:
a first alignment electrode on the first electrode and the second electrode,
wherein the first alignment electrode comprises a first sub-alignment electrode and a second sub-alignment electrode located at a same layer;
the first sub-alignment electrode connects the first electrode and the first contact electrode; and
the second sub-alignment electrode connects the second electrode and the second contact electrode.

9. The display device of claim 8, wherein
the first light emitting element at least partially overlaps the first sub-alignment electrode and the second sub-alignment electrode.

10. The display device of claim 8, further comprising:
two second alignment electrodes located at the same layer as the first alignment electrode,
wherein the two second alignment electrodes are spaced from the first sub-alignment electrode and the second sub-alignment electrode, and are located between the first sub-alignment electrode and the second sub-alignment electrode.

11. The display device of claim 10, wherein
the second light emitting element at least partially overlaps the two second alignment electrodes.

12. The display device of claim 8, further comprising:
a first auxiliary electrode and a second auxiliary electrode located at the same layer as the first alignment electrode,
wherein the first auxiliary electrode and the second auxiliary electrode are spaced from the first alignment electrode, wherein the first alignment electrode is located between the first auxiliary electrode and the second auxiliary electrode.

13. The display device of claim 12, wherein
the first contact electrode comprises a first lower contact electrode and a first upper contact electrode that are located at different layers, wherein the insulation layer is located between the first lower contact electrode and the first upper contact electrode; and
the second contact electrode comprises a second lower contact electrode and a second upper contact electrode that are located at different layers, wherein the insulation layer is located between the second lower contact electrode and the second upper contact electrode.

14. The display device of claim 13, wherein
the first lower contact electrode connects the first sub-alignment electrode and the first end portion of the first light emitting element; and
the second lower contact electrode connects the second sub-alignment electrode and the second end portion of the first light emitting element.

15. The display device of claim 14, wherein
the first upper contact electrode connects the first auxiliary electrode and the first end portion of the second light emitting element; and
the second upper contact electrode connects the second auxiliary electrode and the second end portion of the second light emitting element.

* * * * *